(12) United States Patent
Schamber et al.

(10) Patent No.: US 10,466,285 B2
(45) Date of Patent: Nov. 5, 2019

(54) UTILITY METER HAVING DATA LOGGING WITH POWER LOSS RECOVERY

(71) Applicant: Landis+Gyr LLC, Lafayette, IN (US)

(72) Inventors: David Schamber, Lafayette, IN (US); Daniel Mondot, Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 374 days.

(21) Appl. No.: 14/880,170

(22) Filed: Oct. 9, 2015

(65) Prior Publication Data

US 2016/0103163 A1 Apr. 14, 2016

Related U.S. Application Data

(63) Continuation-in-part of application No. 14/252,502, filed on Apr. 14, 2014.

(60) Provisional application No. 62/062,130, filed on Oct. 9, 2014, provisional application No. 61/811,604, filed on Apr. 12, 2013.

(51) Int. Cl.
*G01R 22/10* (2006.01)
*G01D 4/00* (2006.01)
*G01D 9/00* (2006.01)

(52) U.S. Cl.
CPC .......... *G01R 22/10* (2013.01); *G01D 4/002* (2013.01); *G01D 9/005* (2013.01); *Y02B 90/241* (2013.01); *Y04S 20/32* (2013.01); *Y04S 20/36* (2013.01)

(58) Field of Classification Search
CPC ............................... G01R 22/10; G01D 4/002
USPC ........................................................ 702/61
See application file for complete search history.

(56) References Cited

U.S. PATENT DOCUMENTS

| 4,332,980 | A | 6/1982 | Reynolds et al. |
| 4,445,214 | A | 4/1984 | Reynolds et al. |
| 4,700,188 | A | 10/1987 | James |
| 4,811,249 | A | 3/1989 | Marsh |
| 5,168,170 | A | 12/1992 | Hartig |
| 5,933,004 | A | 8/1999 | Jackson |
| 5,999,808 | A | 12/1999 | Ladue |
| 6,121,158 | A | 9/2000 | Benchikha |

(Continued)

FOREIGN PATENT DOCUMENTS

| EP | 2381579 A1 | 10/2011 |
| JP | 06289927 | 10/1994 |

(Continued)

OTHER PUBLICATIONS

International Search Report & Opinion for PCT/US2014/034035, dated Sep. 2, 2014.

(Continued)

*Primary Examiner* — Hoai V Ho
*Assistant Examiner* — Muna A Techane
(74) *Attorney, Agent, or Firm* — Kilpatrick Townsend & Stockton LLP

(57) ABSTRACT

A method for storing information within a utility meter that includes storing a data stream comprising a plurality of data values regarding a metered quantity delivered to a load corresponding to a plurality of time periods, wherein the plurality of data values are stored sequentially based on their corresponding time periods. The method also includes responsive to a power outage, inserting into the data stream a time stamp corresponding to a time period in the plurality of time periods in which the power outage occurred.

18 Claims, 16 Drawing Sheets

(56) References Cited

U.S. PATENT DOCUMENTS

| | | |
|---|---|---|
| 6,374,188 B1 | 4/2002 | Hubbard |
| 6,564,159 B1 | 5/2003 | Lavoie |
| 6,946,972 B2 | 9/2005 | Mueller |
| 7,769,344 B1 | 8/2010 | Harvey et al. |
| 2004/0202374 A1 | 10/2004 | Venkataraman |
| 2005/0240540 A1* | 10/2005 | Borleske ............... G01D 4/004 705/401 |
| 2008/0042871 A1 | 2/2008 | Donaghey et al. |
| 2008/0301517 A1 | 12/2008 | Zhong |
| 2010/0122143 A1 | 5/2010 | Lee et al. |
| 2010/0315263 A1* | 12/2010 | Shuey ..................... H04Q 9/00 340/870.02 |
| 2011/0071773 A1 | 3/2011 | Saylor |
| 2011/0193569 A1 | 8/2011 | Alrawi |
| 2011/0288793 A1 | 11/2011 | Sanchez-Loureda et al. |
| 2011/0301894 A1* | 12/2011 | Sanderford, Jr. ....... G01D 4/004 702/65 |
| 2012/0010831 A1 | 1/2012 | Kagan |
| 2013/0018843 A1* | 1/2013 | Bultman ................. G06F 17/00 707/609 |
| 2013/0293219 A1* | 11/2013 | Ramirez ................ G01R 22/10 324/103 R |
| 2016/0103163 A1* | 4/2016 | Schamber .............. G01R 22/10 702/61 |

FOREIGN PATENT DOCUMENTS

| | | |
|---|---|---|
| JP | 2006038630 | 2/2006 |
| JP | 2008058006 | 3/2008 |
| JP | 2011244441 | 12/2011 |
| MX | 353163 | 12/2017 |

OTHER PUBLICATIONS

U.S. Appl. No. 14/252,502, "Final Office Action", dated May 17, 2017, 26 pages.

U.S. Appl. No. 14/252,502, Non-Final Office Action dated Oct. 1, 2018, 24 pages.

U.S. Appl. No. 14/252,502, Non-Final Office Action dated Sep. 22, 2016, 23 pages.

U.S. Appl. No. 14/252,502, Non-Final Office Action dated Feb. 5, 2018, 25 pages.

Japanese Application No. 2016-507900, Office Action dated Apr. 10, 2018.

International Application No. PCT/US2014/034035, International Preliminary Report on Patentability dated Oct. 22, 2015, 6 pages.

U.S. Appl. No. 14/252,502, "Notice of Allowance", dated Jun. 6, 2019, 10 pages.

* cited by examiner

BITREAD
VALUE_READ
PREREAD

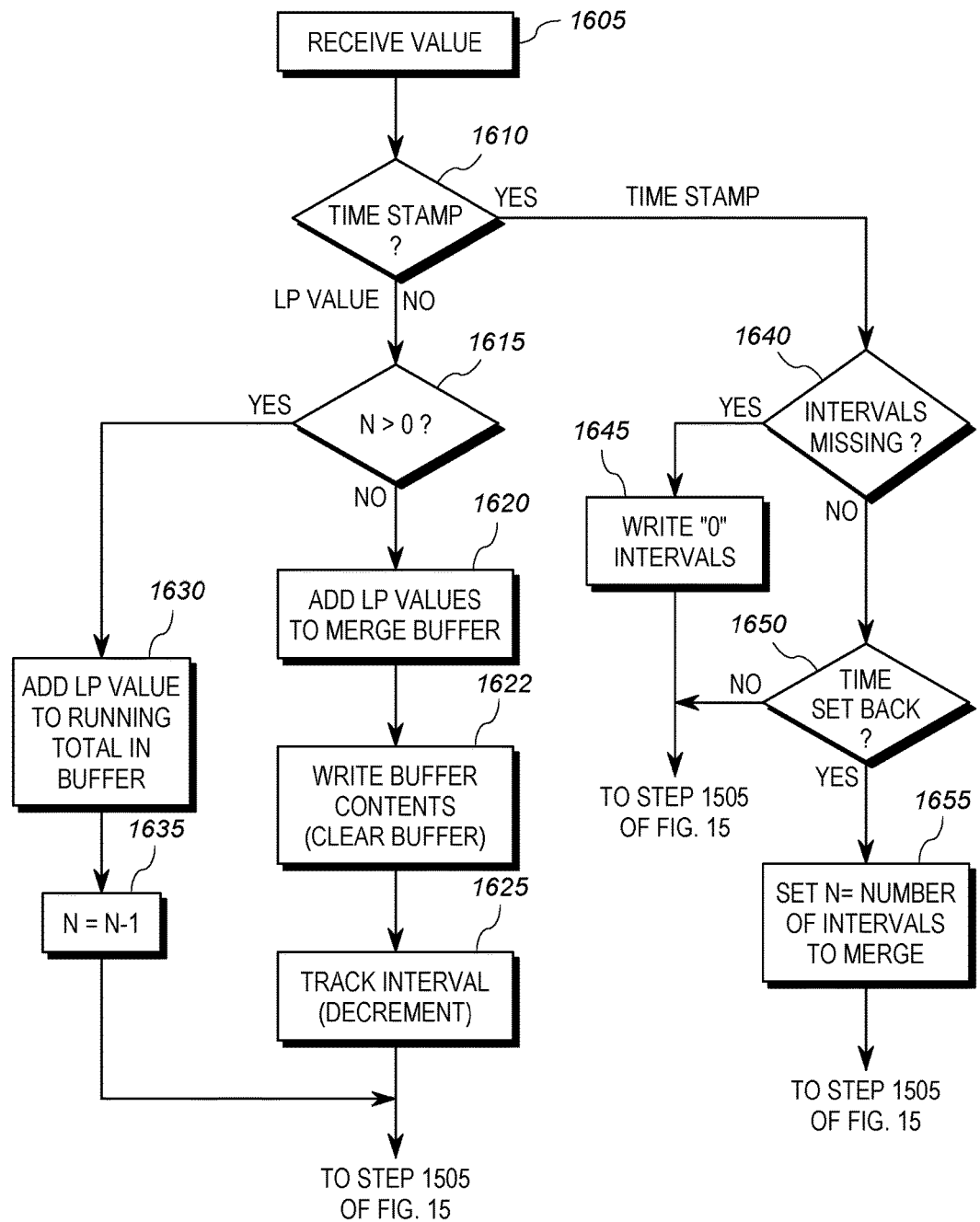
FIG. 16  DATA_READ INTVL_ACCUM

UTILITY METER HAVING DATA LOGGING WITH POWER LOSS RECOVERY

This application claims the benefit of U.S. provisional patent application Ser. No. 62/062,130, filed Oct. 9, 2014, which is incorporated herein by reference, and is a continuation-in-part of U.S. patent application Ser. No. 14/252,502, filed Apr. 14, 2014, which in turn claims the benefit of U.S. Provisional Patent Application No. 61/811,604, filed Apr. 12, 2013.

FIELD OF THE INVENTION

The present invention relates generally to utility meters, and more particularly, to data logging in utility meters.

BACKGROUND

Utility meters are used to monitor the consumption of a utility-delivered commodity, such as, gas, water and/or electricity. The consumption information generated by a utility meter is typically used for billing purposes. For example, in its simplest form, a utility meter detects consumption and records a value representative of a total consumption over time. The consumer of the commodity is billed in proportion to the customer's usage of the commodity as measured by the meter.

Accordingly, one of the goals of electricity metering is to accurately measure the use or consumption of electrical energy resources. With such measurements, the cost of generating and delivering electricity may be allocated among consumers in relatively logical manner. Another goal of electricity metering is to help identify electrical energy generation and delivery needs. For example, cumulative electricity consumption measurements for a service area can help determine the appropriate sizing of transformers and other equipment. Such goals apply similarly to gas and water metering.

In order to study energy usage patterns, and in some circumstances, adjust billing practices appropriately, it is sometimes advantageous to log commodity consumption as a function of time. In electricity metering, this practice is known as load profiling. A load profiling meter stores a series of records identifying one or more metered quantities and a time of day in which the metered quantity was consumed. For example, a load-profiling electricity meter may record and store energy consumption (i.e. watt-hrs), average power, apparent energy consumption (VA-hrs) and amp-hours for each fifteen minute interval in time. The resulting load profile data is stored in a memory, preferably non-volatile memory, within the meter. The meter may communicate the load profile data log to a utility computer by either remote transmission, or through a local connection. Once the load profile data is transferred from the meter, the data may be erased or overwritten within the meter.

Although meters and load profiling systems are designed such that load profile data can be erased from the meter periodically, the storage of load profile data can still require significant amounts of memory. Presently, it is common for meters to generate metering values of up to 32 bits. Storing 32 bit values for multiple quantities every five to fifteen minutes, along with appropriate time and date stamps, can consume substantial memory over the course of time, for example, a month. In addition to the memory requirements, the transfer of such data can occupy significant bandwidth.

Accordingly, there is a need to ease the memory requirement and transmission requirements to carry out load profiling.

SUMMARY OF THE INVENTION

A first aspect of the invention is a method of recording data for load profiling or other purposes within a meter that employs a time recovery scheme for load profiling data stored in a data stream.

A first embodiment is a method for storing information within a utility meter that includes storing a data stream comprising a plurality of data values regarding a metered quantity delivered to a load corresponding to a plurality of time periods, wherein the plurality of data values are stored sequentially based on their corresponding time periods. The method also includes responsive to a power outage, inserting into the data stream a time stamp corresponding to a time period in the plurality of time periods in which the power outage occurred.

The above described features and advantages, as well as others, will become more readily apparent to those of ordinary skill in the art by reference to the following detailed description and accompanying drawings.

BRIEF DESCRIPTION OF THE DRAWINGS

FIG. 16 shows another portion of the flow diagram of FIG. 15.

DETAILED DESCRIPTION

Figure 1:
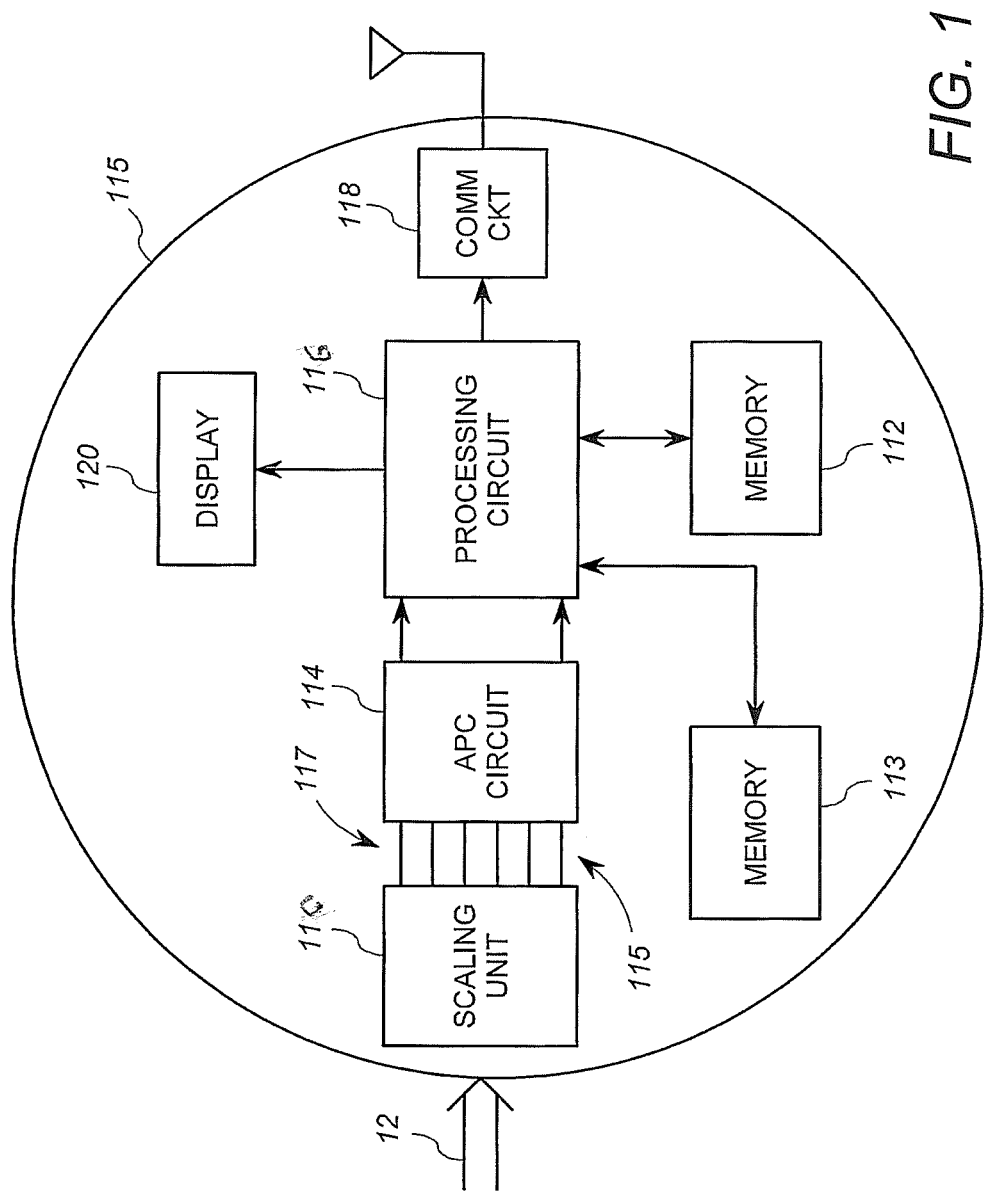
FIG. 1 shows an exemplary meter that may be used in one or more embodiments of the present invention.

FIG. 1 shows an exemplary embodiment of a poly-phase electricity meter 10 in which an arrangement according the invention is implemented. Referring to FIG. 1 specifically, the electricity meter 10 is an apparatus for measuring energy consumption that includes a scaling circuit 110, a first memory 112, a second memory 113, an analog to digital conversion ("ADC") circuit 114, a processing circuit 116, a communication circuit 118, and an optional display 120. All of the above listed elements are preferably supported by a meter housing 115, which may take a plurality of known forms. The communication circuit 118 may be disposed within an interior of the meter housing 115 like the other devices, or may be affixed to the outside of the meter housing 115.

In general, the meter 10 is configured to store load profile data in a compressed way in at least one of the memories 112, 113. As mentioned above, a load profile is a series of periodic snap-shots of measured information (such as voltage, current or energy), which may be used to capture a customer's consumption profile through time, for diagnostic or billing purposes. A load profile may include periodic measurements of a single quantity, such as energy (watt-hrs), or periodic measurement of multiple quantities, each forming a "channel" of the load profile data.

For example, a load profile could record watt hour consumption in a first channel, and VAR-hrs in another channel. The exemplary load profile could store values in both channels for every 5 minute interval over several weeks. An "interval" is the amount of time that corresponds to each piece of data stored, in this case, a five (5) minute time period.

In the embodiment described herein, the load profile data is compressed before being stored in memory 112, preferably an EEPROM inside the meter 10. Unlike generic compression methods, the compression method for load profile data must be adapted for use with a never-ending stream of data, and furthermore does not rely on a dictionary of commonly found patterns (such as used in LZW compression method). Such a dictionary of patterns would quickly become obsolete or would refer to ancient data that would be overwritten.

Instead, the compression method described herein is partly based on the idea that, throughout the course of a day, the load is somewhat stable. Because the load is relatively stable, the data from one interval is not, in general, significantly different from the data of the previous interval. Thus, part of this compression scheme relies on the use of differential values, or in other words, storing for each interval the difference of the actual value measured from the same measured value in the prior interval.

To achieve a compression ratio of about 60% of less, this algorithm:

a) Divides the memory 112 in blocks of data that are "self-contained", meaning that no data from another block is needed to decode that block. This is needed in order to be able to read only part of the data stream without having to decode the stream from the very end of it;

b) Stores the actual value of the data "as is" only for the first or last interval of every block. For every other interval, only the delta (difference between that interval and the next one) is stored. That allows for a smaller number to be stored, per interval, per channel; and c) Compresses smaller numbers using fewer bits than those used for bigger numbers. Since the values being recorded are relatively stable (and hence the differential values are small), more small numbers are recorded than bigger numbers.

Referring again specifically to FIG. 1, the scaling circuit 110 and the ADC circuit 114 are arranged to generate digital signals representative of line voltage waveforms VA, VB, VC for each of three phases A, B, C of a poly-phase electrical system and other digital signals representative of line current waveforms IA, IB, and IC of the poly-phase electrical system. It will be appreciated that the meter 10 need not be one that is configured and use in a poly-phase system. In other embodiments, the meter 10 may be readily be configured for a single phase residential system, or any other common electrical service.

In any event, the digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 112, or preferably some combination of the foregoing. At least some energy consumption values are stored in the first memory 112 using one or more of the compression techniques disclosed herein.

In further detail, the scaling circuit 110 may suitably comprise current and voltage sensors, not shown. The voltage sensors, which may, for example, include voltage dividers, generate a scaled down version of the voltage present on phases of the power lines 12. The current sensors, which may suitably include current transformers, shunts, embedded coil devices and the like, generate a voltage or current signal that is a scaled down version of the current present on the phases of the power lines 12. Various voltage and current sensors are conventional. However, the embodiments of the invention may readily be employed with non-conventional sensors as well.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. Nos. 6,374,188; 6,564,159; 6,121,158 and 5,933,004, all of which are incorporated herein by reference. Moreover, the ADC circuit 114 may readily be a part of an integrated metering chip package, as will be discussed below.

The processing circuit 116 is a device that employs one or more processing devices such as microprocessors, microcontrollers, digital signal processors, discrete digital circuits and/or combinations thereof. In general, the processing circuit 116 executes software operations stored in memory to perform the various operations ascribed to the processing circuit 116 herein. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$Whrs=\Sigma V_n * I_n. \tag{3}$$

where Whrs is an accumulated energy value (i.e. watt-hours) for a time frame from a starting time $n_0$ to a time corresponding to n.

In addition, the processing circuit 116 may generate VA, VA-hrs, watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. Nos. 6,374,188; 6,564,159; 6,121,158 and 5,933,004. However, in one preferred embodiment, the processing circuit is (or includes) a processing element of a metering integrated circuit chip such as the Maxim 71M6533 measurement chip.

In accordance with one embodiment, the processing circuit 116 is configured to generate first information regarding a metered quantity delivered to a load corresponding to a first period of time. The first information may be an actual measured quantity over the first period time (e.g. watt-hrs consumed over the first period of time, average power during the first period of time, etc.), or a difference between a measured quantity over the first period time and the measured quantity over a previous period of time (e.g. a differential value). The processing circuit is further configured to obtain a stored code associated with one of a plurality of predetermined ranges of values in which the first information falls. In particular, within the meter, each possible value of the metering quantity (e.g. a 32-bit value) is associated with one of a plurality or ranges of values. The processing circuit 116 is configured to determine which of the ranges of values the first information falls within, and determine the code associated with that range of values. The processing circuit 116 is also configured to generate a compressed value representative of a numerical position of the first information within one of the plurality of predetermined ranges of values. Finally, the processing circuit 116 is further configured to store the code and the compressed value in a memory, for example, the first memory 112.

In at least some embodiments, the second memory 113 includes memory located within the integrated package that houses the processing circuit 116. The second memory 113 may suitably be a random access memory, EEPROM, other memory, or a combination of several types of memory. The second memory 113 includes a software program that is executed by the processing circuit 116 to perform the operations of the processing circuit 116 described herein, including those of FIGS. 3, 4 and 7. The second memory 113 also suitably stores operational values used by the processing circuit 116 during normal operations.

The communication circuit 118 is a device that is in some embodiments configured to communicate data between the metering unit 10 and one or more remote devices. In a system such as that shown in FIG. 1, the communication circuit 118 would be operable to communicate directly or indirectly with a data collection system of a utility service provider. Several of such systems are known. In at least some embodiments, the utility service provider uses the collected data to generate billing information and/or data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other devices may operate in the kHz or low MHZ range.

Figure 8:
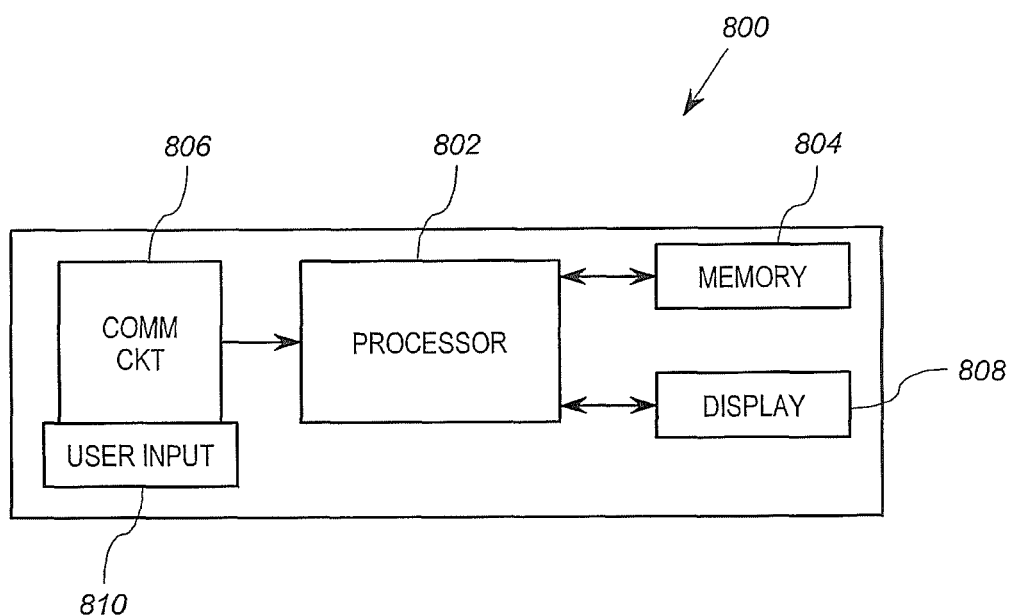
FIG. 8 shows a schematic block diagram of a computing device configured to read out and decompress data compressed using the data compression operation of FIG. 4.

In addition or in the alternative, the communication circuit 118 is configured to communicate with a locally coupled device, such as a portable computing device via an optical port. The communication circuit 118 may include an optical or electrical data port, not shown, for this purpose. FIG. 8, discussed further below, shows one exemplary portable computing device that is configured to communicate locally with the metering unit 10 via the communication circuit 118.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

In general, the scaling unit 110 of the meter 10 is operably connected to the electrical service lines to obtain voltage measurements and current measurements representative of the voltage and current delivered to the load. The scaling unit 110 is further operably coupled to provide voltage and current measurement signals to the ADC circuit 114.

The ADC circuit 114, in turn, samples each of the voltage and current measurement signals and generates corresponding digital sample streams. The sample rate is typically many times the cycle frequency of the AC waveform, such that the samples collectively provide an accurate sampled representation of the corresponding analog waveform. The operations of the scaling unit 110 and the ADC circuit 114 as discussed above are conventional.

The processing circuit 116 then calculates watt-hrs by multiplying contemporaneous voltage and current samples, and accumulating the resulting products. Using sampling, the processing circuit 116 may suitably perform the following calculations:

$$\text{Watt-hr}_a=\Sigma(V_a(s)*I_a(s)) \tag{1}$$

$$\text{Watt-hr}_b=\Sigma(V_b(s)*I_b(s)) \tag{2}$$

$$\text{Watt-hr}_c=\Sigma(V_c(s)*I_c(s)) \tag{3}$$

$$\text{Watt-hr}=\text{Watt-hr}_a+\text{Watt-hr}_b+\text{Watt-hr}_c \tag{4}$$

wherein $V_x(s)$ is the sampled voltage at a time s on phase x at the meter 10, and $I_x(s)$ is the sampled current at a time s on phase x at the meter 10. In the above equations, the term Watt-hr is actually an energy measurement in terms of watt-hrs.

The processing circuit 116 may suitably calculate vector (or load) VARs using equations that use 90 phase degree shifted voltage measurements, as is known.

$$VAR_a=\Sigma(V_a(s+90°)*I_a(s)) \tag{5}$$

$$VAR_b=\Sigma(V_b(s+90°)*I_b(s)) \tag{6}$$

$$VAR_c=\Sigma(V_c(s+90°)*I_c(s)) \tag{7}$$

$$VAR=VAR_a+VAR_b+VAR_c \tag{8}$$

It will be appreciated that the various other value may be calculated using the samples signals Va(s), Vb(s), Vc(s), Ia(s), Ib(s), and Ic(s), include per-phase or aggregate average power, amp-hrs, VA, VA-hrs, and the like.

The processing circuit 116 performs such calculations in an ongoing manner to thereby detect, track and record various aspects about the energy being delivered to the load. Thus, the scaling circuit 110, the ADC circuit 114 and at least a part of the processing circuit 116 collectively form a metrology circuit 117 that is operably coupled to power lines 12 to a load and configured to generate energy consumption values based on the voltage and current provided to the load. It will be appreciated that the metrology circuit 117 may take other forms that are conventional.

In addition, from time to time, for example, every five to fifteen minutes, the processing circuit 116 stores information relating to one or more metering values in the memory 112 as part of a data log or "load profile". Each stored value is associated with a defined time interval. It will be appreciated that the processing device(s) of the circuit 116 that perform load profiling may or may not be or include the same processing device of the processing circuit 116 that forms a part of the metrology circuit 117.

Figure 2:
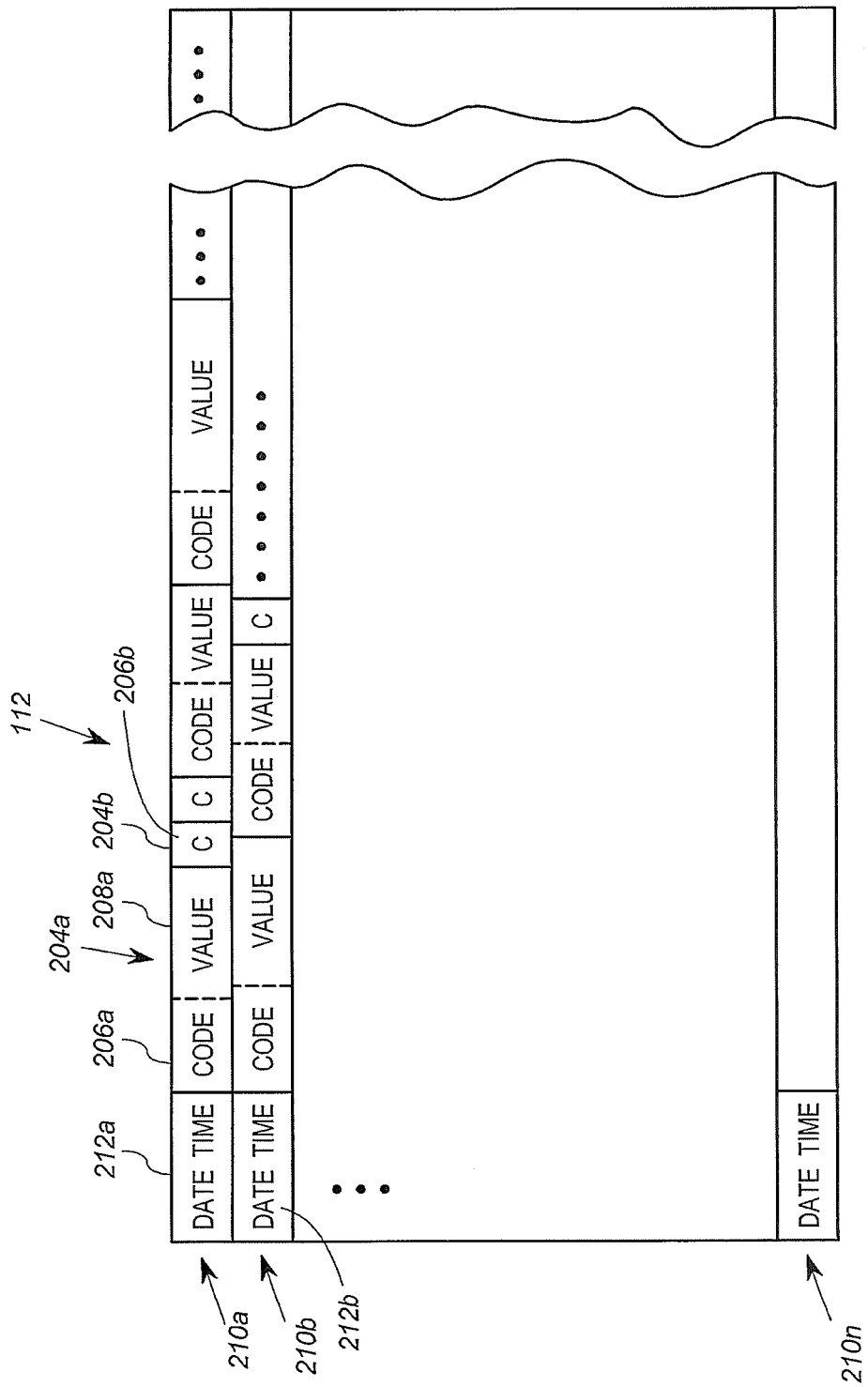
FIG. 2 shows a schematic block diagram of a memory of the meter of FIG. 1 storing data compressed in accordance with a first embodiment of the invention.

In accordance with embodiments of the present, the memory 112 is an EEPROM memory divided into physical blocks. Referring now to FIG. 2, the first memory 112

Referring now to the embodiment of FIG. 2, the first memory 112 stores a data log of a "load profile", wherein information corresponding to metering data for a defined block of time is stored in a way that the time in which the metering data was generated can be identified. The data is stored sequentially such that the timing of the data can be reconstructed by obtaining an anchor time for one interval's data, and then adding or subtracting the interval time for each successive data record, depending on the reading direction.

In FIG. 2, the memory 112 stores the data log as a plurality of compressed values 204a, 204b, etc. At least some compressed values, such as the compressed value 204a, includes at least a prefix 206a and a suffix 208a. Other compressed values, such as the compressed value 204b, include only a single prefix 206b. In this embodiment, the prefix 206a is a first value or code that corresponds to and identifies one of a plurality of predetermined ranges of values. The suffix 208a is a second value that represents a number within the one of the plurality of predetermined ranges of values. By way of non-limiting example, Table 1 shows a plurality of ranges of values, and the prefix (i.e. first value) 206x that corresponds to that range. The entire range of values of Table 1 covers every possible 32-bit value.

TABLE 1

| prefix (first value) 206 binary code | prefix length | suffix (second value) 208 binary code | value 204 encodes for negative values | suffix (second value) 208 binary code | value 204 encodes for positive values | suffix length | Total length |
|---|---|---|---|---|---|---|---|
| 0 | 1 | — | — | — | 0 | 0 | 1 |
| 10000 | 5 | 1000-1111 | −8 to −1 | 0000-0111 | +1 to +8 | 4 | 9 |
| 10001 | 5 | 1000-1111 | −16 to −9 | 0000-0111 | +9 to +16 | 4 | 9 |
| 10010 | 5 | 10000-11111 | −32 to −17 | 00000-01111 | +17 to +32 | 5 | 10 |
| 100110 | 6 | 100000-111111 | −64 to −33 | 000000-011111 | +33 to +64 | 6 | 12 |
| 100111 | 6 | 1000000-1111111 | −128 to −65 | 0000000-0111111 | +65 to +128 | 7 | 13 |
| 101000 | 6 | 10000000-11111111 | −256 to −129 | 00000000-01111111 | +129 to +256 | 8 | 14 |
| 101001 | 6 | etc . . . | −512 to −257 | etc . . . | +257 to +512 | 9 | 15 |
| 101010 | 6 | etc . . . | −1024 to −513 | etc . . . | +513 to +1024 | 10 | 16 |
| 101011 | 6 | etc . . . | −2048 to −1025 | etc . . . | +1025 to +2048 | 11 | 17 |
| 101100 | 6 | etc . . . | −4096 to −2049 | etc . . . | +2049 to +4096 | 12 | 18 |
| 101101 | 6 | etc . . . | −8192 to −4097 | etc . . . | +4097 to +8192 | 13 | 19 |
| 101110 | 6 | etc . . . | −16384 to −8193 | etc . . . | +8193 to +16384 | 14 | 20 |
| 101111 | 6 | etc . . . | −32768 to −16385 | etc . . . | +16385 to +32768 | 15 | 21 |
| 110000 | 6 | etc . . . | −65536 to −32769 | etc . . . | +32769 to +65536 | 16 | 22 |
| 110001 | 6 | etc . . . | −131072 to −65537 | etc . . . | +65537 to +131072 | 17 | 23 |
| 110010 | 6 | etc . . . | −262144 to −131073 | etc . . . | +131073 to +262144 | 18 | 24 |
| 110011 | 6 | etc . . . | −524288 to −262145 | etc . . . | +262145 to +524288 | 19 | 25 |
| 110100 | 6 | etc . . . | −1048576 to −524289 | etc . . . | +524289 to +1048576 | 20 | 26 |
| 110101 | 6 | etc . . . | −2097152 to −1048577 | etc . . . | +1048577 to +2097152 | 21 | 27 |
| 110110 | 6 | etc . . . | −4194304 to −2097153 | etc . . . | +2097153 to +4194304 | 22 | 28 |
| 110111 | 6 | etc . . . | −8388608 to −4194305 | etc . . . | +4194305 to +8388608 | 23 | 29 |
| 111000 | 6 | etc . . . | −16777216 to −8388609 | etc . . . | +8388609 to +16777216 | 24 | 30 |
| 111001 | 6 | etc . . . | −33554432 to −16777217 | etc . . . | +16777217 to +33554432 | 25 | 31 |
| 111010 | 6 | etc . . . | −67108864 to −33554433 | etc . . . | +33554433 to +67108864 | 26 | 32 |
| 111011 | 6 | etc . . . | −134217728 to −67108865 | etc . . . | +67108865 to +134217728 | 27 | 33 |
| 111100 | 6 | etc . . . | −268435456 to −134217729 | etc . . . | +134217729 to +268435456 | 28 | 34 |
| 111101 | 6 | etc . . . | −536870912 to −268435457 | etc . . . | +268435457 to +536870912 | 29 | 35 |
| 111110 | 6 | etc . . . | −1073741824 to −536870913 | etc . . . | +536870913 to +1073741824 | 30 | 36 |
| 111111 | 6 | etc . . . | −2147483648 to −1073741825 | etc . . . | +1073741825 to +2147483647 | 31 | 37 | includes a plurality of blocks 210a, 210b, . . . 210n. FIG. 2 illustrates the memory 112 populated by data compressed in accordance with a first embodiment of the invention. The first embodiment is a simplified version of a load profile for a single meter value that is compressed and stored in the memory 112. FIGS. 4-8, discussed further below, show another embodiment that uses the same compression scheme to store multiple values in a load profile log.

It can be seen from the above table that each range of uncompressed values includes in this embodiment a negative side and a positive side, to allow negative numbers to be logged as well. In general, each prefix 206x defines which range (i.e. which row in the table) is applicable, and the suffix 208x represents a numerical or sequential position of the corresponding uncompressed value within the range. So for example, consider a value 204a compressed as 10100000001111. This value splits into a prefix 206a of 101000, and a suffix 208a of 00001111. From the above table, the prefix 206a of 101000 identifies that the value is in the range of −256 to −129 and 129 to 256. The first bit of the value "00001111", which is 0, indicates that the value is in the positive half-range: 129 to 256. The binary value 0001111 corresponds to 15, which indicates that the value is the fifteenth in sequence in the range of 129 to 256. Because 129+15=144, the decompressed value is 144. In other words, the compressed value of 10100000001111 equates to 144. It will be appreciated that although the decompressed value could be any 32-bit value, this particular value has been compressed to 14 bits.

It will be appreciated that information representative of the Table 1, or at least the portion thereof related to the prefixes and the corresponding ranges of values, may be stored in a memory that is different than the memory 112, for example, the memory 113 or some other memory. In this way, the compressed load profile data may be stored separately from operating data of the meter 10.

Referring again to FIG. 2, it will be appreciated that the second compressed value 204b includes only a single prefix value with no suffix. As shown in Table 1, the single code value 0 represents a single-bit range of uncompressed values, namely, 0. Thus, a value of "0" in a 32-bit system can be compressed to a single bit, such as the second compressed value 204b of FIG. 2. It will be appreciated that the compression scheme shown in Table 1 enables such compression because only one prefix 206x starts with a binary value of 0. Simple digital logic or processing operations can immediately determine that any compressed value is a single value, and not part of some longer prefix 206x. Similarly, if any code starts with a 1, and the next four digits represent a value of 0 to 2 (binary) included, then the code is a five-bit code. Any other code starting with a one is a six-bit code.

Referring again specifically to FIG. 2, in the embodiment described the memory 112 each block 210x of memory 112 includes an initial value 212x that is a date-time stamp. The time-date stamp 212x at the beginning of each block 210x allows for quick indexing/access to load profile metering data for a particular day and time.

In operation, the processing circuit 116 performs normal metering operations to obtain various metering values, such as watt-hours (real energy), VA-hrs (apparent energy), and VAR-hrs (reactive energy), current, voltage, as well as other values. At specific intervals, for example, the processing circuit 116 compresses and stores information relating to those meter values in the memory 112. In this embodiment, the processing circuit 116 stores a compressed version of an actual metering value, such as watt-hrs consumed in the last interval, or overall, as the first value 204a for the first interval after the time stamp 212a. For subsequent time intervals (until the block 210a is full), the processing circuit 116 compresses and stores the difference in the metering value from the last time interval. Thus, each block 210x starts with a time stamp value 212x, a first value 204a that is a compressed version of an absolute metering value, and a plurality subsequent values 204b, 204c, etc. that are compressed versions of a differential metering value.

Figure 3:
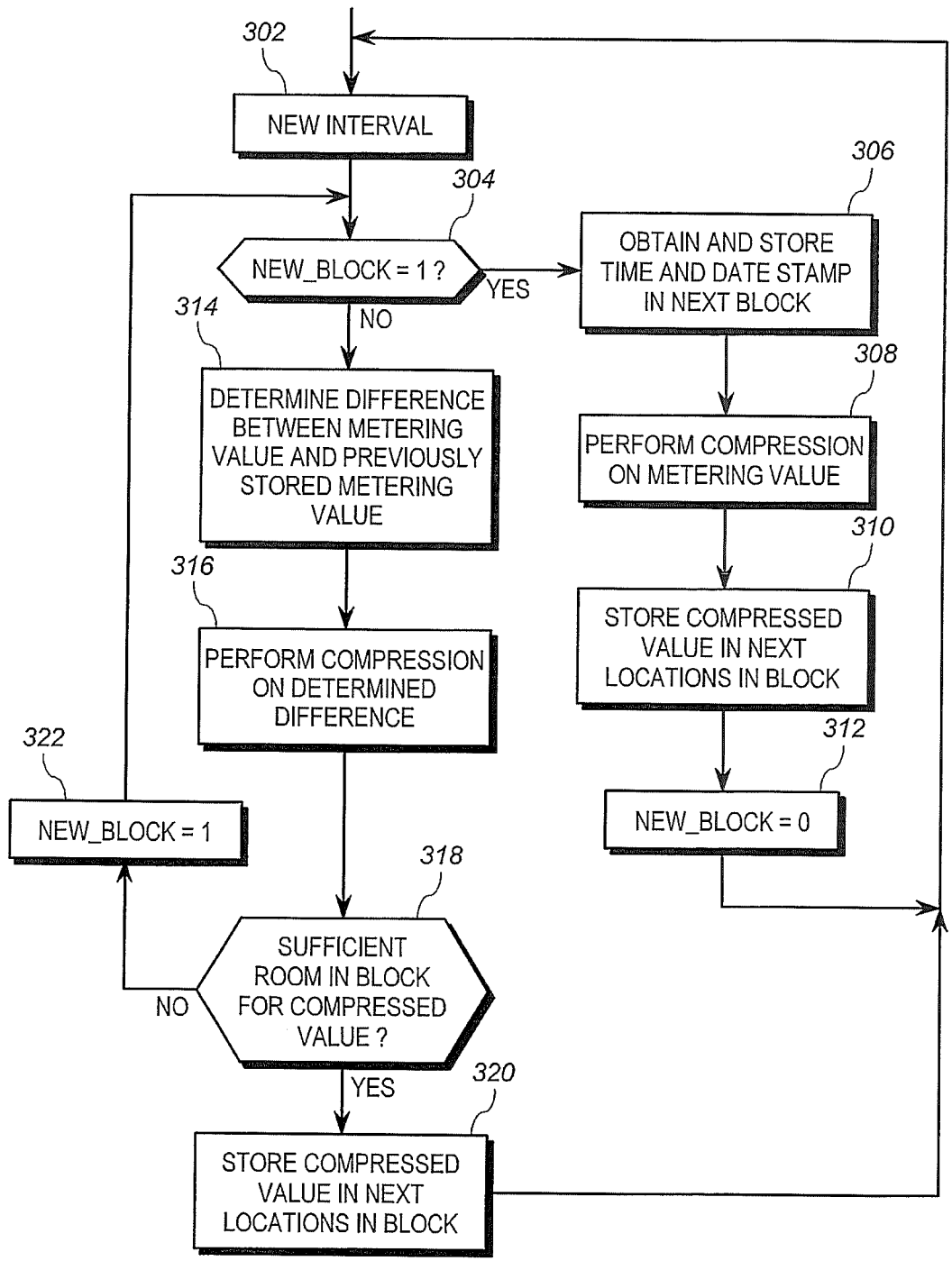
FIG. 3 shows a flow diagram of an exemplary set of operations of the processing circuit of the meter of FIG. 1 in carrying out a data compression operation.

FIG. 3 shows a flow diagram of an exemplary set of operations of the processing circuit 116 to carry out the operation as discussed above. The operations of FIG. 3 occur at every load profile time interval, such as every 1 to 60 minutes (step 302). The processing circuit 116 first determines if a NEW_BLOCK flag, representing that a new memory block will be stored to (step 304). If NEW_BLOCK is set, then the processing circuit 116 proceeds to step 306. If not, then the processing circuit 116 proceeds to step 314.

In step 306, the processing circuit 116 obtains a time and date stamp and stores it in the first bit locations of a new block 210x of the memory 112. The processing circuit 116 then (step 308) performs a compression step on the metering value that is being "profiled" or logged. As discussed above, this value may be the watt-hrs consumed over the last time interval, VAR-hrs consumed over the last time interval, total watt-hrs, or other values. As will be discussed below, the data log may be divided into multiple channels so that several values may be logged, each value occupying a different, but consistent channel.

In any event, after step 308, the processing circuit 116 stores the compressed value (step 310) in the next memory locations in the memory 112. Thereafter, the processing circuit 116 resets NEW_BLOCK (step 312) and then returns to step 302 to await the next time interval.

Referring back to step 304, if it was determined that NEW_BLOCK is not set, then the processing circuit 116 determines the difference between the current metering value to be logged, and the previously logged metering value (step 314). Thus, in step 314, the processing circuit 116 determines a differential value for the metering value being logged or profiled. In step 316, the processing circuit 116 performs the compression operation on the determined differential value. The processing circuit 116 thereafter proceeds to step 318.

In step 318, the processing circuit 116 determines whether the current block 210x of the memory 112 has sufficient space for the compressed value generated in step 316. If so, then the processing circuit 116 stores the compressed value in the next memory locations of the current block 210x (step 320) and returns to step 302 to await the next time interval. If not, however, then the processing circuit 116 sets NEW_BLOCK=1 (step 322) and proceeds directly to step 304.

It will be appreciated that the above-operations may readily be adapted for multiple channels of data logging, as will be discussed below in connection with FIGS. 4-8. In such a case, multiple values (e.g. watt-hrs, VAR-hrs, etc.) are each compressed and stored as per FIG. 3 every interval.

It will further be appreciated that the compression steps 308, 316 both operate in the same manner on their respect values to be compressed. In step 308, the value to be compressed, CV, is the metering value. In step 316, the value CV is the determined differential value. In either case, the processing circuit 116 uses a look-up table or the like to determine the appropriate prefix 206 (e.g. from FIG. 2) based on the range in which the value CV falls. The processing circuit 116 then determines the suffix 208 based on the numerical position (or some other one-to-one correlation) of CV with the range.

Thus, several features of this embodiment are particularly useful in load profiling in electricity meters. In particular, the use of differential values for a large portion of the stored interval data combined with the significant compression of smaller values can result in substantial overall reduction in memory usage as compared to storing full 32-bit values for each new interval. It will be appreciated that the inventive compression scheme described herein may readily be adapted to other value sizes, such as 16-bit or 64-bit values, as well as others.

There are quasi unlimited ways to implement this principle. But the basic ideas are to: Extract the differences between slowly changing numbers; Encode them in bit patterns of smaller size for smaller values and bigger size for larger values (e.g. Table 1); and Place markers at regular intervals so that the bit stream hence created doesn't need to rely on the existence of data that is too old (e.g. the time and data stamps 212a, 212b, etc.). Thus, old data can be discarded and the bit stream can still be read. It will further be appreciated that the compression scheme is lossless, meaning that the decompressed data does not experience any loss of information from the original data that was compressed.

FIGS. 4-8 illustrate a compression and load profiling method that may be carried out to store information to the memory 112 for multiple metering values, and further includes other additional features for preserving the use of memory and for ease of reading out. For example, the embodiment of FIGS. 4-8 stores compressed load profiling data such that the memory 112 may be read out and decompressed in a direction opposite of the way it is written. In general, the actual compression used in the embodiment of FIGS. 4-8 are identical to those described above in connection with FIG. 2 and Table 1.

Figure 4:
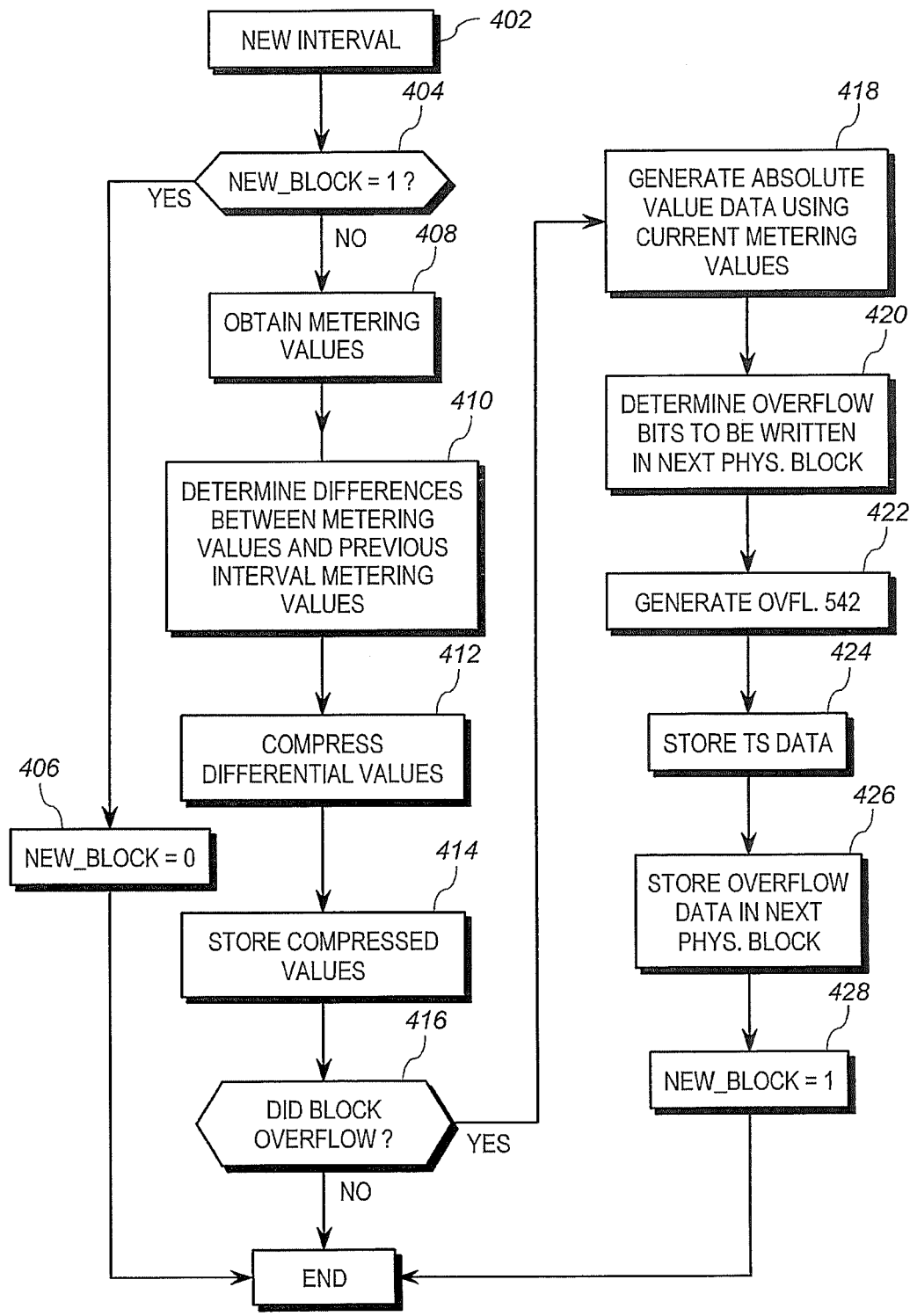
FIG. 4 shows a flow diagram of an exemplary set of operations of the processing circuit of the meter of FIG. 1 in carrying out a data compression operation in accordance with a second embodiment of the invention.

FIG. 4 shows a flow diagram 400 of a set of operations that, like that of FIG. 3, is carried out every load profile (or other timing) interval, such as every 1 to 60 minutes. In other words, the flow diagram 400 shows an alternative to the operations of FIG. 3. FIG. 4 will be discussed below in reference to FIGS. 5A and 5B.

Figure 5A:
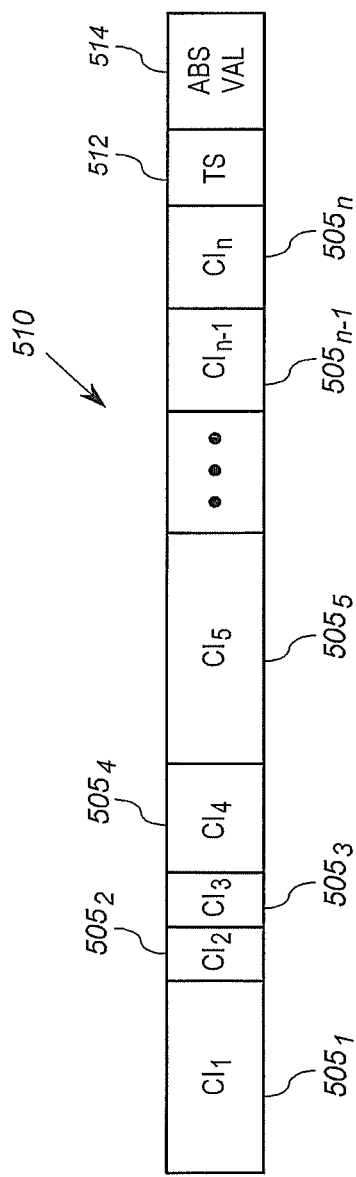
FIG. 5A shows a schematic diagram of a portion of the memory of the meter of FIG. 1 storing data compressed using the data compression operation of FIG. 4.

FIG. 5A shows an alternative embodiment of a logical memory block 510 that may be stored in the memory 112. The term logical memory block 510 refers to a collection of compressed values (and other values), stored in the memory 112, that are approximately sufficient to fill a physical memory block of an EEPROM. However, because compressed interval values (e.g. values 204a, 204b of FIG. 2) have variable lengths, it is rare that a particular compressed value or set of compressed values will exactly fill a physical memory block. As a consequence, in the embodiment described here below, a logical memory block 510 may be split into two physical memory blocks, with the second physical block acting as an overflow for the first. To this end, FIG. 5B shows a fragmentary view of the ends of two adjacent memory physical memory blocks 550, 552 of the memory 112, which contain, among other things, the logical memory block 510.

Figure 5B:
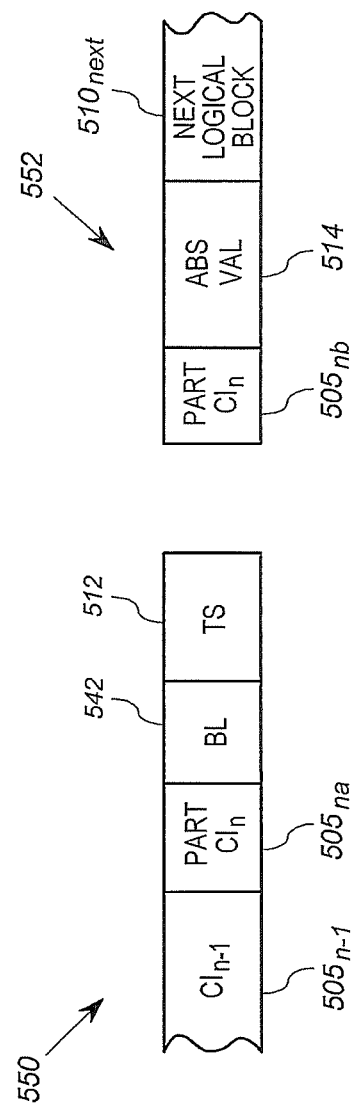
FIG. 5B shows a fragmentary schematic diagram of two physical data blocks of the memory of the meter of FIG. 1 storing data compressed using the data compression operation of FIG. 4.

Referring to FIGS. 5A and 5B, the logical memory block 510 and the physical memory blocks 550, 552 have a plurality of bit-locations wherein bits of data may be stored and read sequentially. In accordance with the embodiment described herein, each logical memory block 510 stores date-and-time stamp (TS) data 512 and absolute value data 514. The TS data 512 and the absolute value data 514 are preferably disposed at or near an end of the block. In the remainder of the bit-locations are compressed intervals $505_x$. A compressed interval $505_x$, discussed further below, is all of the metering data for a specified time interval x, which has been compressed using the manner describe above in connection with steps 314, 316 of FIG. 3, or similar method.

Referring to FIG. 5B, the physical memory block 550 stores the TS value 512 of the logical memory block 510 at an end location thereof. It will be appreciated that the physical memory block 550 stores nearly all of the logical memory block 510. However, the absolute value data 514 and/or the last compressed interval $505_n$ may be stored partially or fully in the next physical memory block 552 as an overflow. In the example discussed herein, the last compressed interval $505_n$ is stored partially in each of the physical memory blocks 550, 552, and the absolute value data 514 is stored completely in the next memory block 552. To this end, a part $505_{na}$ of the compressed interval $505_n$ is stored in the physical memory block 550 and another part $505_{nb}$ of the compressed interval $505_n$ is stored in the physical memory block 552. The absolute value data 514 represents the end of the logical block 510. In the physical memory block 552, the subsequent bit locations are used to store the next logical block $510_{next}$.

In the embodiment of FIG. 5B, the physical memory block 550 ends with an overflow length block 542 and the time stamp data 512, each of which has predetermined bit-size. The overflow length block 542 identifies how many bits of the logical block 510 that are stored in the next physical data block 552. In other words, the value in the overflow length block represents the number of bits of the part $505_{nb}$ and the absolute value data 514. It will be appreciated that the physical memory block 552 and other physical memory blocks will have the same general structure as the physical memory block 550. Each one terminates in an overflow length block 542 and time stamp value 512 in identical corresponding positions. However, the number of bits and sizes of partial compressed intervals (e.g. $505_{na}$, and $505_{nb}$) and absolute value data (e.g. 514) will vary for each individual physical data block.

Figure 6A:
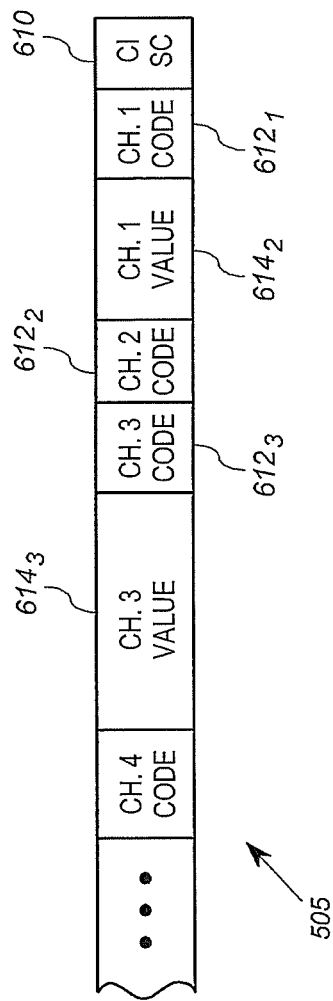
FIGS. 6A-6C show schematic diagrams of different data structures used in the data compression operation of FIG. 4.

FIG. 6A shows in further detail a single compressed interval 505 which illustrates the general format of the compressed intervals $505_x$ of FIGS. 5A and 5B. The compressed interval 505 includes an interval start code 610, which indicates that the following data is compressed interval data 505. In this embodiment, the interval start code is "1", a single bit. As will be discussed below, all other start codes (e.g. for TS data 512 and absolute value data 514) begin with "0" and have additional bits. The interval start code 610 is chosen as the only single bit code because the compressed interval 505 typically occurs the most often.

The compressed interval 505 then includes a sequential series of prefixes $612_y$ and suffixes $614_y$ for each of a plurality of channels, where y is the channel index. As discussed above, each "channel" corresponding to a specific metering value that is logged in every time interval. Each channel is compressed separately. To this end, each channel prefix $612_y$ is generated in the same way as the prefix 206 of FIG. 2, and each channel suffix $614_y$ is generated in the same way as the suffix 208 of FIG. 2. Thus, for example, the prefix $612_1$ indicates the range of values in which the corresponding metering value falls, as per Table 1, while the suffix $614_1$ indicates where within the indicated range the corresponding meter value falls, as per Table 1. As with the embodiment of FIG. 1, the prefix $612_y$ (such as prefix $612_2$) can be single 0 bit indicative of a compressed value of "0", or (such as prefixes $612_1$ or $612_3$) can be a five or six bit number that identifies the size and applicable range of the suffix $614_y$ as per Table 1. It will be appreciated, however, that the same compression scheme can be carried out with different values and/or different groupings of values, and not just those shown in Table 1.

Figure 6B:
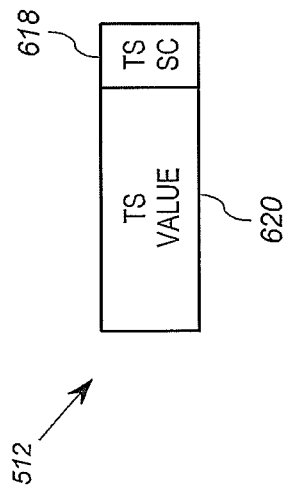
Figure 6C:
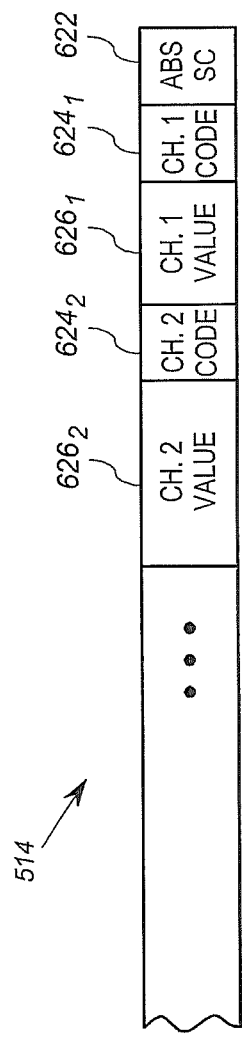

Referring again to FIGS. 5A, 5B, the absolute value data 514 is a set of non-differential compressed values for an interval. FIG. 6C shows a fragmentary view of an absolute value data block 514. Referring to FIG. 6C, for each channel y of the load profile data, the absolute value data 514 includes a prefix $624_y$ and suffix $626_y$, similar to the prefixes $612_x$ and suffixes $614_x$ of the compressed interval $505_x$. However, in the absolute value data 514, the compressed data is not representative of the difference between the current interval and the prior interval, but rather is a compressed version of the actual metering data for the current interval. Thus, the absolute value data 514 is generated using the same compression method discussed above, but applied to actual metering values such as kWh, peak demand, $I_{RMS}$, etc. The absolute value data 514 also includes a start code 622, which in this embodiment is a four digit code indicating an absolute value block. The absolute value data 514 in every logical data block and physical data block helps protect against a large loss of data if part of the data becomes corrupted. In particular, if all of the data were differential (from period to period), then the corruption of any data can cause the loss of large amounts of data because the differential reference values are corrupted. The periodic insertion of absolute value blocks 514 allows for ease of data recovery in the event of data corruption.

Referring again to FIGS. 5A, 5B, the time stamp (TS) data 512 comprise a set of values representative of real time and date, or at least the real time of day. FIG. 6B shows a TS data block 512. Referring to FIG. 6B, the TS data block 512 includes a TS data start code 618 and a time stamp value 620. As discussed above, the time stamp value 620 is representative of at least the time of day, and preferably the time and date. The time stamp value 620 may suitably be compressed using any conventional lossless technique. Because time stamps do have the same features as the load profile data, the compression technique for the time stamp data 620 need not be the one used to encode the channel data. The start code 618 in this embodiment is a four digit code indicating a time stamp block.

Referring again to FIG. 5A, the logical memory block 510 is arranged in the manner described herein to allow for ease of reading out of values. To this end, the block 510 is generally written from left-to-right in FIG. 5A, and read out from right-to-left. The physical memory blocks 550 and 552 are written and read in the same way.

Referring now to FIG. 4, the operations start off at the conclusion of a load profile time interval (step 402). At the end of a time interval, the "current interval", the processing circuit 116 determines whether the flag value NEW_BLOCK=1 in step 404. If so, then the current interval is not processed because it is the first of a new logical data block 510, and the processing circuit proceeds to step 406. In step 406, the value NEW_BLOCK is reset to 0 and the processing for the interval ends. If, however, it is determined in step 404 that NEW_BLOCK=0, then the processing circuit 116 proceeds to step 408 to start processing the current interval.

In step 408, the processing circuit 116 obtains the metering values for the current interval. In this embodiment, multiple metering values, including a set of status values, are logged for each time interval. It will be appreciated that any number of channels may be logged in the memory 112, one channel per value. In this example, the values of watt-hours and amp-hours for the current interval are tracked, as well a set of status bits for the meter 10. Each of these values is a 32-bit value in uncompressed format. Status codes can include flags indicating whether there has been a power outage in the interval, whether there has been a clock change or tampering event during the interval, etc.

The processing circuit 116 then, in step 410, determines the difference between the metering values for the current interval, and same metering values from the prior interval. Thus, in step 410, the processing circuit 116 determines a differential value for the metering values being logged or profiled. Thus, in the example described herein, the processing circuit 116 would determine the difference between watt-hours consumed in the prior interval and the current interval, the difference between amp-hours consumed in the prior interval and the current interval, and the difference in status codes (numerical) between the prior interval and the current interval. This is done for each channel being profiled or logged.

In step 412, the processing circuit 116 performs the compression operation on each determined differential values separately, using the method described above in connection with FIG. 3. Thus, for example, if three 32-bit values are being logged or profiled, then each 32-bit metering value is separately compressed into a code and compressed value using Table 1 (or another scheme). Thus, the result of step 410 is a compressed interval $505_x$ such as the one shown in FIG. 6a. It will be appreciated that for values that do not change in many one to sixty minute intervals, such as status values, the compressed data log will be only a single "0" bit. For metering and/or status values that do change, they will nevertheless be compressed using the operations discussed above in connection with Table 1, by identifying an appropriate code value (e.g. code value $206x$, $612x$) and a corresponding compressed value ($208x$, $614x$).

It will be appreciated that steps 410 and 412 are performed on a channel-by-channel basis.

In step 414, the compressed values are stored in the current physical data block, e.g. the data block 550. If the data block 550 overflows (after reserving space for the time stamp data 512 and the overflow length block 542), then the compressed data is stored to an overflow buffer.

After all of the channel data for the interval is stored in step 414, the processing circuit 116, in step 416, determines whether the data overflowed the current physical data block. As discussed above, the current physical data block overflows if the compressed interval data determined in steps 410, 412 exceeds the available bit-locations in the physical data block, while reserving a predetermined number of bits for the time stamp data 512 and the overflow length value 542. For example, at the end of the compressed interval $505_{n-1}$ of FIGS. 5A and 5B, the processing circuit 116 would determine that no overflow occurred. By contrast, at the end of the compressed interval $505_n$, the processing circuit 116 would determine that an overflow has occurred.

If the processing circuit 116 determines in step 416 that no overflow has occurred, then the processing of the current interval is completed, and the process ends. If the processing circuit 116 determines instead that an overflow has occurred, then the processing circuit 116 proceeds to step 418 to process the end of the logical data block 510.

In step 418, the processing circuit 116 first generates an absolute data block 514 using the current interval metering values. Thus, after step 418, the processing circuit 116 has generated both the compressed interval ($CI_n$) based on the current metering values and the prior interval metering values, and a compressed absolute data block 514 based on the current metering values. Thereafter, in step 420, the processing circuit 116 determines how many bits of the compressed interval and the absolute data block will be stored in the next physical data block (e.g. physical data block 552). For example, in the example of FIG. 5B, the processing circuit 116 would determine the number of bits in the part $505_{nb}$ and the absolute value block 514. In step 422, the processing circuit 116 uses the determined number of bits to generate the overflow length data 542, and stores the same at a predetermined location near the end of the current physical data block 550. In step 424, the processing circuit 116 furthermore obtains, compresses and stores the time stamp data 512 in the final bits of the current physical data block 550.

Thereafter, in step 426, the processing circuit 116 writes overflow data (e.g. blocks $505_{nb}$ and 514) to the next physical data block 552. The overflow data is written in the first (or last) bit-locations in the physical data block 552. Subsequent compressed intervals $505_x$ from the next logical data block $510_{NEXT}$ will be stored sequentially thereafter in the physical data block 552. In step 428, the processing circuit 116 sets NEW_BLOCK to 1 and then ends the processing of the current interval.

Figure 7:
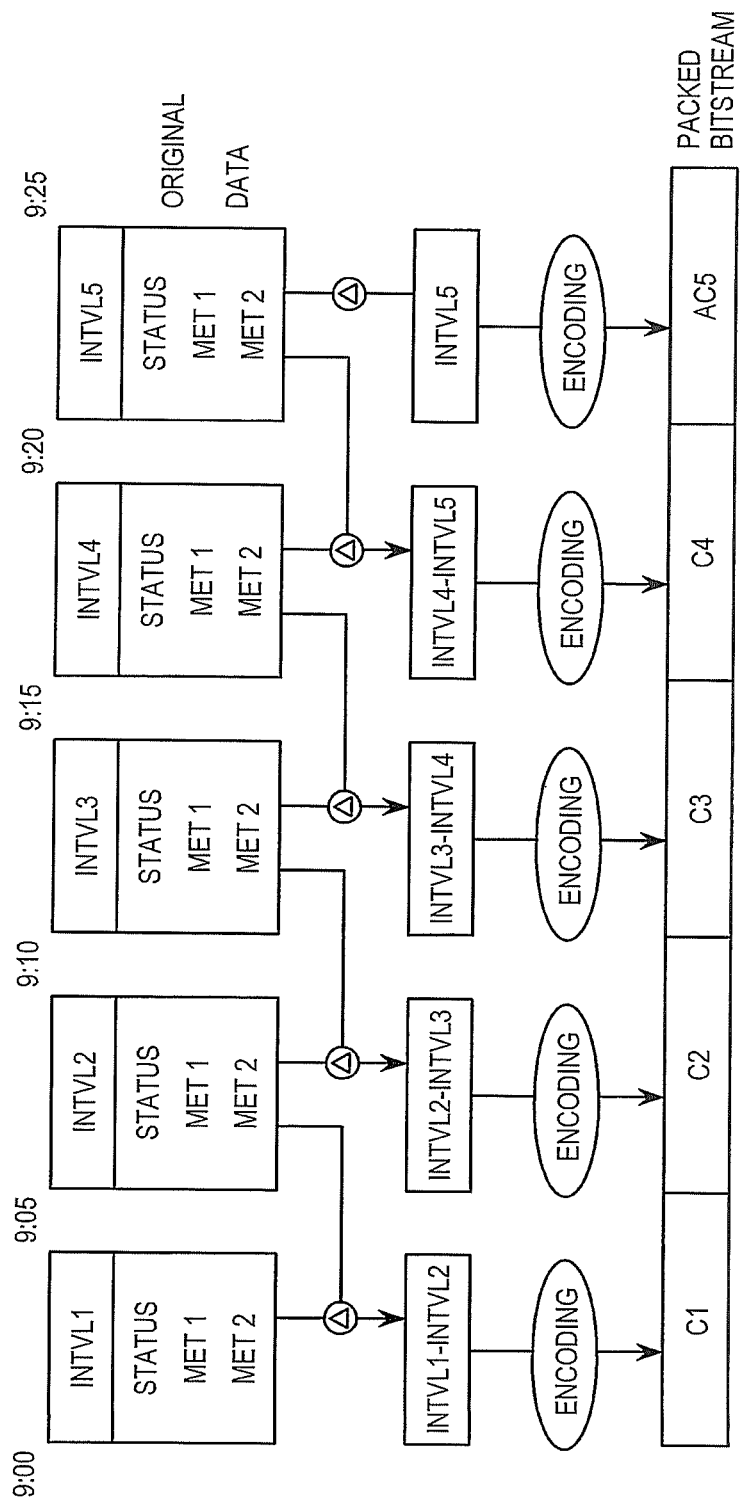
FIG. 7 shows a timing diagram of an exemplary compression operation carried out using the data compression operation of FIG. 4.

As discussed above, one advantage of the embodiment described herein is that the logical data block 510 (and hence physical data blocks 550, 552, etc.) are written in one direction, and read out in the opposite direction. FIG. 7 shows a block diagram of an example of the process of FIG. 4 for writing of multiple channels, including a channel dedicated to status information, of data to the logical memory block 510 of FIG. 5 over five intervals, each interval of five minutes length. In this embodiment three metering values (channels) are logged for each interval, including a Status value, a Metering 1 value, and a Metering 2 value. Each of the values Status, Metering 1, and Metering 2 is a 32-bit value and corresponds to a channel of the log. In particular, the Status value may suitably be a number of one-bit or multi-bit status indicators combined together as a single value. The Metering 1 value is a 32-bit value representative of energy consumed over an interval (e.g. watt-hrs), and the Metering 2 value is a 32-bit value representative of ampere-hours consumed over an interval.

In the example of FIG. 7, it will be assumed that the data from five intervals Intvl1, Intvl2, Intvl3, Intv4 and Intvl5 fit in a memory block (e.g. the memory block 510). It will further be assumed that a new block is started at the interval Intvl1. Thus, NEW_BLOCK=1. The example of FIG. 7 will be described in conjunction with the flow diagram of FIG. 4.

At 9:05, the interval Intvl1 is complete (step 402). The processing circuit 116 determines that NEW_BLOCK=1 in step 404, and performs no further actions, other than to reset the NEW_BLOCK=0 (step 406).

At 9:10, the interval Intvl2 is complete (step 402). The processing circuit 116 determines that NEW_BLOCK=0 in step 404, proceeds to step 408. The processing circuit 116 obtains the metering values Status(Intv2), Metering 1(Intv2), and Metering 2(Intv2) for the interval Intvl2 (step 408). Such values, of course, may be maintained in an ongoing basis by the processing circuit 116 to the extent that the processing circuit 116 forms a part of the metrology circuit 117 of the meter 10 of FIG. 1. The processing circuit 116 then determines the difference between each of the values Status(Intv2), Metering 1(Intv2), and Metering 2(Intv2) and the respective values from the previous interval and Status(Intvl1), Metering 1(Intvl1), and Metering 2(Intvl1) (step 410). In other words, the processing circuit 116 performs the following operations:

Status(δ)=Status(Intvl1)−Status(Intvl2)

Metering 1(δ)=Metering 1(Intvl1)−Metering 1(Intvl2)

Metering 2(δ)=Metering 2(Intvl1)−Metering 2(Intvl2).

The processing circuit 116 then performs compression operations on each of the differential values Status(δ), Metering 1(δ), and Metering 2(δ) to generate corresponding compressed values Status(CV), Metering 1(CV) and Metering 2(CV) (step 412). As per the compression algorithm discussed herein, each of the compressed values Status(CV), Metering 1(CV) and Metering 2(CV) may have a different bit-length, which is identified in the code portion (e.g. $612_y$, of FIG. 6A) of each compressed channel value.

The processing circuit 116 stores the compressed values Status(CV), Metering 1(CV) and Metering 2(CV) as a compressed interval $505_1$ in bit-position sequence in the memory block 510. (Step 414). Referring to FIG. 6A, the compressed value Status(CV) may suitably be stored as the prefix $612_1$ and suffix $614_1$, the compressed value Metering 1(CV), assuming it is "0" in this example, may suitably be stored as the prefix $612_2$, and compressed value Metering 2(CV) may suitably be stored as the prefix $612_3$ and suffix $614_3$, In FIG. 7, the composite compressed bit-stream portion C1, which is the combination of Status(CV), Metering 1(CV) and Metering 2(CV), is stored in the initial part of the memory block 510. The compressed bit-stream portion C1 corresponds to compressed interval $505_1$ of FIG. 5A.

After storing the compressed bit-stream portion C1, and assuming no overflow occurred (step 416), the processing circuit 116 awaits the next time interval, or until 9:15.

At 9:15, the interval Intvl3 is complete. (Step 402). The processing circuit 116 determines that NEW_BLOCK=0 in step 404, proceeds to step 408. The processing circuit 116 obtains the metering values Status(Intv3), Metering 1(Intv3), and Metering 2(Intv3) for the interval Intvl3 (step 408). The processing circuit 116 then determines the difference between each of the values Status(Intv3), Metering 1(Intvl3), Metering 2(Intvl3) and the respective values from the previous interval and Status(Intv2), Channel 1(Intv2), and Channel 2(Intv2) (step 410). In other words, the processing circuit 116 performs the following operations:

Status(δ)=Status(Intvl2)−Status(Intvl3)

Metering 1(δ)=Metering 1(Intvl2)−Metering 1(Intvl3)

Metering 2(δ)=Metering 2(Intvl2)−Metering 2(Intvl3).

The processing circuit 116 then performs compression operations on each of Status(δ), Metering 1(δ), and Metering 2(δ) to generate corresponding compressed values Status(CV), Metering 1(CV) and Metering 2(CV). (Step 412). The processing circuit 116 stores the compressed values Status(CV), Metering 1(CV) and Metering 2(CV) in sequence in the memory block 510. (Step 414). In FIG. 7, the composite compressed bit-stream portion C2, which is the combination of the current Status(CV), Metering 1(CV) and Metering 2(CV), is stored immediately following C1 in the memory block 510. The compressed interval C2 corresponds to the compressed interval $505_2$ of FIG. 5A.

After storing the compressed bit-stream portion C2, and assuming no overflow (step 416), the processing circuit 116 awaits the next time interval, or until 9:20.

The processing circuit 116 performs analogous operations at 9:20 (Intvl4) to store the next compressed differential values of Status, Metering 1, and Metering 2 as C3 in the memory location adjacent to that storing C2. The compressed interval C3 corresponds to the compressed interval $505_3$ of FIG. 5A.

At 9:25, the fifth interval Intvl5 is complete (step 402). The processing circuit 116 performs analogous operations at 9:20 to store the next compressed differential values of Status, Metering 1, and Metering 2 as C4 in the memory location adjacent to that storing C3. The compressed interval C4 corresponds to the compressed interval $505_4$ of FIG. 5A. However, it is assumed for this example that the processing circuit 116 has determined that the logical data block 510 is complete (presumably because the physical data block 550 has overflowed as determined in step 416). In such a case, the processing circuit 116 generates a compressed version of the absolute (not differential) metering values Status(Intv5), Metering 1(Intv5), and Metering 2(Intv5) for the interval Intvl5 using the same general method described above in connection with Table 1. (Step 418). The processing circuit 116 then stores, for the current interval, the compressed absolute values Status(CAV), Metering 1(CAV), and Metering 2(CAV), as well as a time stamp, not shown in FIG. 7. (Steps 424, 426).

As a result, the processing circuit 116 then stores the absolute values Status(CAV), Metering 1(CAV), and Metering 2(CAV) in the block 510 after the value C4 as the value AC5. As discussed above, part of the interval values C4 and AC5 with the other part of C4 may be in adjacent physical memory blocks.

One of the advantages of the operations of FIGS. 4 and 7 is the ease with which the information may be read out. In general, load profile data has the most utility when it can be analyzed by the service provider. Accordingly, the data log in the memory 112 can be decompressed and transmitted by the meter itself, or can be accessed and decompressed by another device. Thus, the information stored in the data stream C1, C2, C3, C4 and AC5 of FIG. 7 is read out in reverse.

FIG. 8 shows an exemplary computing device 800 that may be used to obtain and decompress load profile data such as the data stored in the memory 112 in the method discussed above in connection with FIGS. 4 and 7. The computing device 800 may be a portable computing device used by a meter reading technician to download the data directly from the meter, or may be a remote computer that receives the data from a wired and/or wireless network transmission. To this end, the computing device 800 includes processor 802, a memory 804, a communication circuit 806, a display 808 and a user input device 810. The processing device 802 may suitably be any microprocessor of a general purpose, tablet, smartphone, or special purpose computer. The memory 804 preferably includes one or more volatile and non-volatile memory devices that are operably connected to the processing device 802. The memory 804 includes programming instructions for the processing device 802, and further provides space for the processing device 802 to store data such as uncompressed load profile data as discussed below. The display 808 and user input device 810 may suitably be any of those typically employed on readily available portable computers, desktop computers, tablet device, or smart phone device. The communication circuit 806 is a device configured to communicate with the communication circuit 118 of the meter 10 of FIG. 1. In one example, the communication circuit 806 includes infrared communication devices used to communicate directly with similar devices on the meter 10. In another example, the communication circuit 806 includes a modem that is configured to communicate digital signals over a network that can include the Internet, a wireless network, or a power line carrier (PLC) network.

In general, the communication circuit 806 receives data, such as the load profile data from the memory 112, and provides the data to the processing circuit 802. The processing circuit 802 receives and decompresses the data, which may then be stored for processing by the processing circuit 802 or another processing circuit, not shown. The processing circuit 802 in some cases may simply store the compressed data 802 in the memory 804 when first received, and then perform the decompression operations at a subsequent time.

Figure 9:
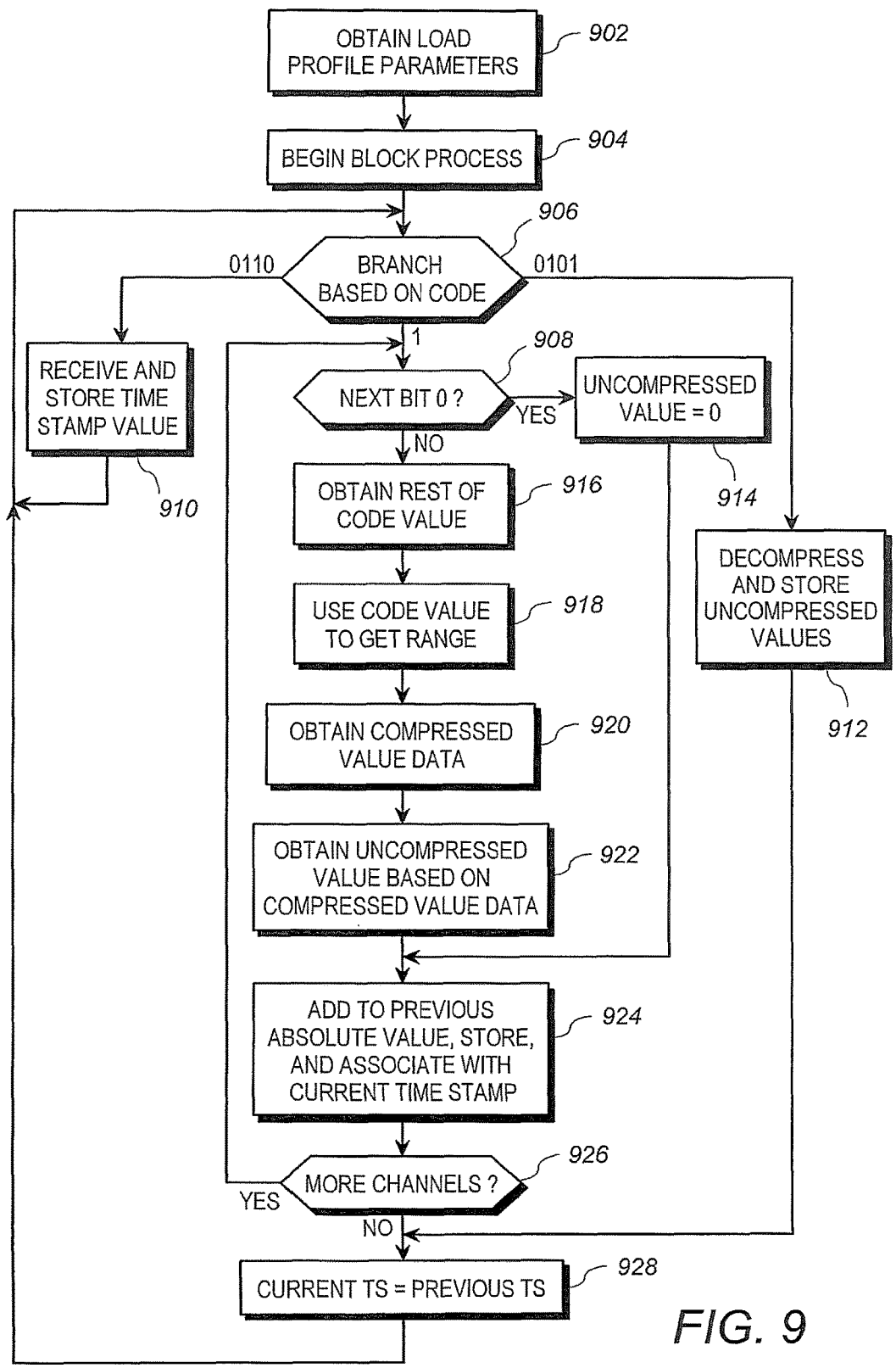
FIG. 9 shows a set of operations for carrying out decompression of data using the data compression operation of FIG. 4.

FIG. 9 shows a flow diagram of the operation of the decompression operation of the processing circuit 802.

In step 902, the processing circuit 802 obtains the load profile or data log parameters for the compressed data received by the communication circuit 806 from the meter 10. Such parameters can include the number of channels (i.e. values per time interval), the length of each interval. In some cases, the parameters can include an identification of the compression scheme and possibly even the Table 1 information. It will be appreciated that in some embodiments, the parameters may be entered manually, or preprogrammed into the memory.

Once the parameters of the compressed data log are known, the processing circuit 802 then begins by starting the decompression of the next block to be decompressed (step 904). As mentioned above, the decompression operation takes place by reading out data for each block in the opposite order in which it was stored. Thus, with reference to FIG. 5A, the data is read out for logical data block 510 starting with the absolute value data 514, and proceeding from right-to-left in the block 510. Thereafter, another block may be read out in the same way. In the embodiment described herein, however, the data is actually read from the physical data block 550 by reading the time stamp 512, and then the overflow length value 542. The rest of the logical data block 510 is read out by obtaining number of bits identified in block 542 from the next physical data block 552, and reading the absolute value data 514, the part $505_{nb}$ of the compressed interval $505_n$, proceeding to the physical data block 550, reading the part $505_{na}$ of the compressed interval $505_n$, and then otherwise proceeding as per FIG. 5A to read the rest of the compressed intervals $505_x$ of the logical data block 510 from the physical data block 550.

Accordingly, in step 906, the processing circuit 802 obtains the first bit of the data, which will include a code for the type of data that will be the following bits. The processing circuit 802 then performs different steps depending on the retrieved code. In this embodiment, if the first code bit is "1", then the ensuing data will be a compressed interval 505. (See element 610 of FIG. 6a). The processing circuit 802 would then proceed to step 908 to process a compressed interval. If, however, the first bit code bit is a "0", then the processing circuit 802 reads the next three bits as a continuation of the code. If the next three code bits are one sequence, e.g. 110, then the next block is a time stamp value 512, and the processing circuit 802 proceeds to step 910. If the next three code bits are yet another sequence, e.g. 101, then the next block is absolute value data 514 and the processing circuit 802 proceeds to step 912. Another four bit code, not shown, indicates that the next data is an overflow length value 542, which the processing circuit 116 would use to retrieve the overflow bits from the adjacent memory, from which point the processing circuit 116 can insert into the bit stream being read out from right to left.

It will be appreciated that other four-digit codes may be used to signal and end of the block or the insertion of other types of data.

In the case of step 910 (TS data), the processing circuit 802 obtains the next P bits and processes the time stamp data 512 to obtain the time stamp value. As discussed above the time stamp value is compressed into the time stamp data 512 using other techniques, or a special look-up table. The number P is predetermined because the length of time stamps is relatively consistent. In this embodiment, the processing circuit 802 stores the time stamp value and associates it with immediately previously received uncompressed values. If no uncompressed values were previously received, then the processing circuit 802 uses the time stamp value to identify a power interruption or other malfunction, and fixes the log accordingly. The processing circuit 802 then returns to step 906.

In the case of step 912 (absolute value data), the processing circuit 802 obtains and decompresses the absolute value data block 514. To this end, the processing circuit 802 employs the operations of steps 908 and steps 914-922, discussed further below. The processing circuit 802 stores the uncompressed meter values and proceeds to step 928, also discussed below.

In the case of step 908 (compressed interval), the processing circuit 802 retrieves the next bit, which is the first bit of the compressed interval 510. The first bit is the first (or only) bit of the code value $612_1$ for the first channel of data. If the first bit is a 0, then the processing circuit 802 proceeds to step 914. In step 914, the processing circuit 914 determines the uncompressed value to be 0. As discussed above, a code value of "0" indicates that the compressed value is also zero, and therefore a separate compressed value is not present. (See, e.g. Channel 2 code $612_2$ of FIG. 6). Thus, the processing circuit 802 needs to perform no further decompression and proceeds directly to step 924, discussed further below.

If, however, the processing circuit 802 determines in step 908 that the first bit is not a 0, then the processing circuit 802 proceeds to step 916. In step 916, the processing circuit 802 obtains the next Q bits to obtain the full non-zero code value $612_x$. As can be seen from Table 1 above, the number Q is determinative of length. If the first five bits are 10000, 10001 or 10010, then the number Q is five bits. If any other combination occurs, then the number Q is six bits. The processing circuit 802 then proceeds to step 918. In step 918, the processing circuit 802 uses a look-up table in the memory 804 to identify the range of values for the associated compressed value $614_x$ based on the code value $612_x$. For example, if the code value $612_x$ is 101001, then the processing circuit 802 determines that the associated value range is the −512 to −257 and 257 to 512 (including sign bit).

Thereafter, in step 920, the processing circuit 802 obtains the next R bits, which constitute the compressed value $614_x$. The number of bits R is predetermined for the range of values identified by the code value $612_x$. To this end, the look-up table in the memory 804 also associates a number of bits for each code value $612_x$. In step 922, the processing circuit 802 uses the compressed value $614_x$ to identify the corresponding number in the identified range from step 918. To this end, the first sign bit is identified, and then the remaining compressed value represents the numerical position of the value within the identified range. Thus, in the above example having a code value of 100110, the nine compressed value bits include a sign bit and eight value bits. In an example having a positive sign bit and remaining bits of 00000010, the processing circuit 802 would identify the corresponding uncompressed value of 257+(00000010) or 259. Once the decompressed value for the channel is identified, the processing circuit 802 proceeds to step 924.

In step 924, the processing circuit 802 first adds the uncompressed value to the stored, uncompressed absolute metering value from the prior interval. In other words, because the compressed values of a compressed interval $505_x$ are differential, the uncompressed values must be added to the previously processed value, which are absolute values, to obtain the full uncompressed value for the present interval.

The processing circuit 802 stores the uncompressed absolute metering value for the current channel and current interval, which in turn will be used to recreate the uncompressed absolute metering value for the next interval. In addition, the processing circuit 802 stores the uncompressed value in a way that associates the uncompressed value with a corresponding time stamp. The corresponding time stamp is determined based on the previously stored interval time minus the interval time period. Thus, if the current interval is the next interval after the time stamp obtained in step 910, then the associated time is B minutes earlier than the time stamp obtained in step 910, where B is determined by the log parameters obtained in step 902. Otherwise, the current time stamp is just the previous time stamp identified from the last processed compressed interval 505, minus B minutes. Thus, because the data is read out from the block 510 in reverse, they are read out in reverse chronological order and the time stamps decremented for each new interval that is decompressed.

In step 926, the processing circuit 802 determines if additional channels are to be processed for the current interval. The processing circuit 802 determines this from the log parameters received in step 902. If so, then the processing circuit returns to step 908. If not, then the processing circuit 802 proceeds to step 928.

In step 928, the processing circuit 802 has completed decompressing the compressed interval. The processing circuit 802 then sets the "previous time stamp" equal to the current time stamp, and returns to step 906 to process the next bit.

In this manner, the processing circuit 802 stores in its memory 804 an uncompressed load profile. The uncompressed load profile data may have a standardized data format dictated by ANSI standards known in the art. The processing circuit 802 may then communicate the uncompressed data to another processor, not shown, for analysis. It will be appreciated that in some cases, the meter processing circuit 116 can be programmed to perform the steps of FIG. 9. However, instead of storing the uncompressed and formatted data the processing circuit 116 may decompress the data and stream the data out through the communication circuit 118 to another device. Using this process, only the internal meter processing circuit 116 need understand the type of compression being used. After performing the steps of FIG. 9, the resulting load profile data stream provided by the processing circuit 116 may suitably be in a format that conforms to industry standards.

It is known that the meter 10 can undergo a power failure from time-to-time, which can interrupt load profile log. It is necessary to identify or otherwise smoothly handle interruptions in the load profile log, particularly in systems such as the one identified above where the data stream of the load profile log has few time stamps.

FIGS. 10-16, discussed below, illustrate an embodiment of the load profiling method described herein that gracefully handles power interruptions that in some cases involve the loss of the real-time clock within the meter 10. It will be appreciated that when the term "time" is used herein, it can mean time and date, and when "time stamp" is used herein, it can mean a time-and-date stamp".

In general, when the meter 10 undergoes a power failure, the processing circuit 116 stores the time of the power failure. When power is restored, the processing circuit 116 performs certain load profiling steps based on information on the power failure. (See, e.g. FIG. 14, discussed below). The information on the power failure includes, typically, the notification of the power failure, the time when the meter shut down, and the time power was restored to the meter. The processing circuit 116 generates such information in its other meter supervisory operations.

Figure 10:
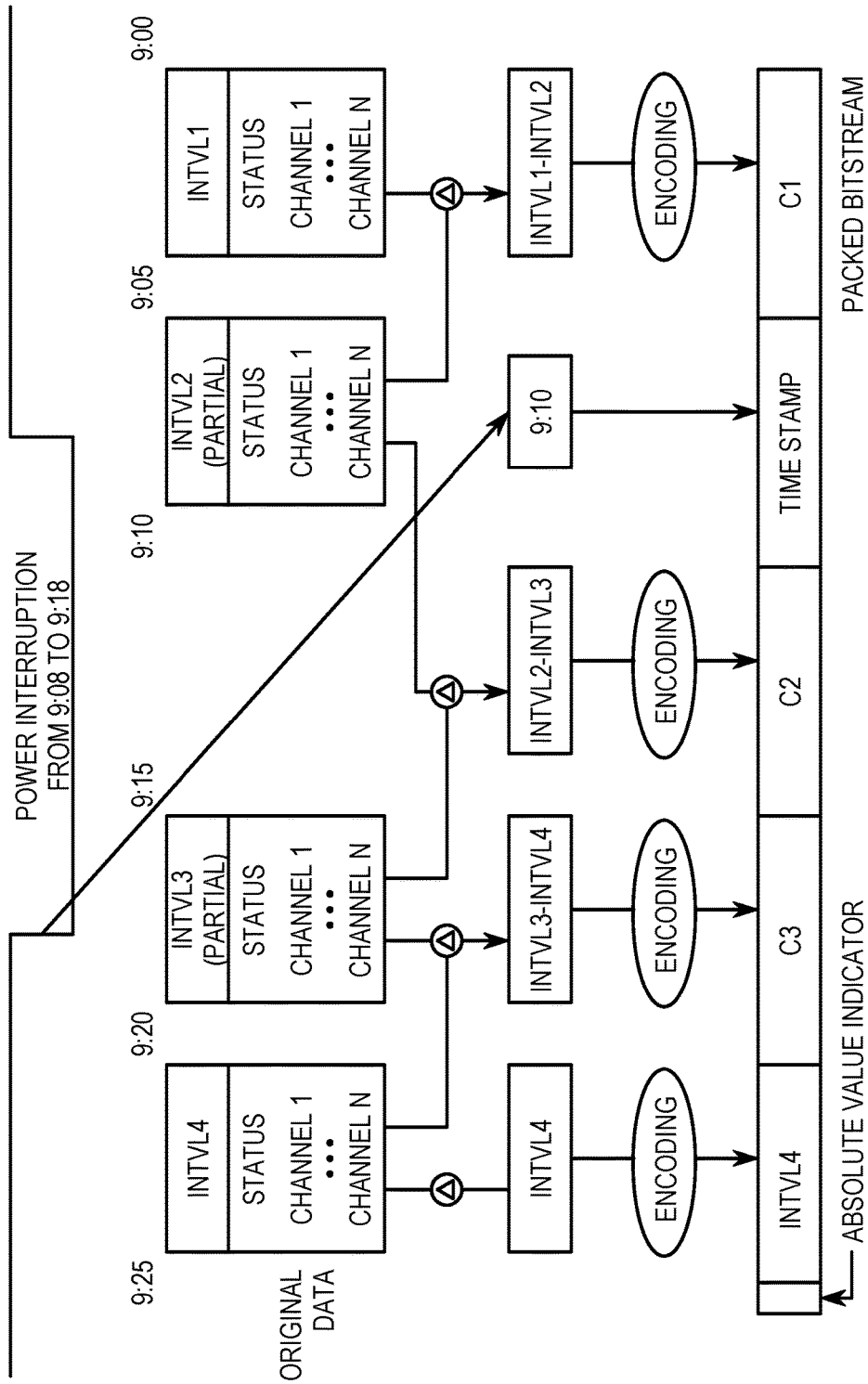
FIG. 10 shows an exemplary timing diagram of the generation of a compressed data stream from an exemplary sequence of load profile data over several time intervals which include a power outage.

FIG. 10 shows an exemplary timing diagram of the compression scheme disclosed above wherein a power outage occurs. The timing diagram is similar to that of FIG. 7, except that the time flow is opposite, with time advancing from right to left in FIG. 10. In this case, the power interruption happens from 9:08 to 9:18. At 9:18, under normal circumstances, when power is recovered, the processing circuit 116 obtains the time of the interruption (9:08), which had been stored, and obtains the current time (9:18). To this end, the meter can keep time during many power outages using a "sleep mode" timer. The processing circuit 116 then stores in the compressed data stream a time stamp representative of the end of the interval during which power was interrupted. For example, since the power failed in the 9:05 to 9:10 interval, the processing circuit 116 generates a time stamp of 9:10, and inserts the time stamp in the data stream using, for example, the format shown in FIG. 6B.

When the compressed data of FIG. 10 is read out, then the reading processor (802 and/or 116) will "know" that all intervals between the one where time was restored (9:15 to 9:20) and the interval when time went out (9:05 to 9:10) are to be skipped, or read as zero. The reader processor 802/116 "knows" this based on the fact that the reader effectively tracks the time of intervals as they are read out. Because the reader processor 802/116 can identify the time of the current interval being read out, and can read the time stamp, the reader processor 802/116 can determine how many time intervals are to be filled with zero because they spanned the power outage.

Figure 12:
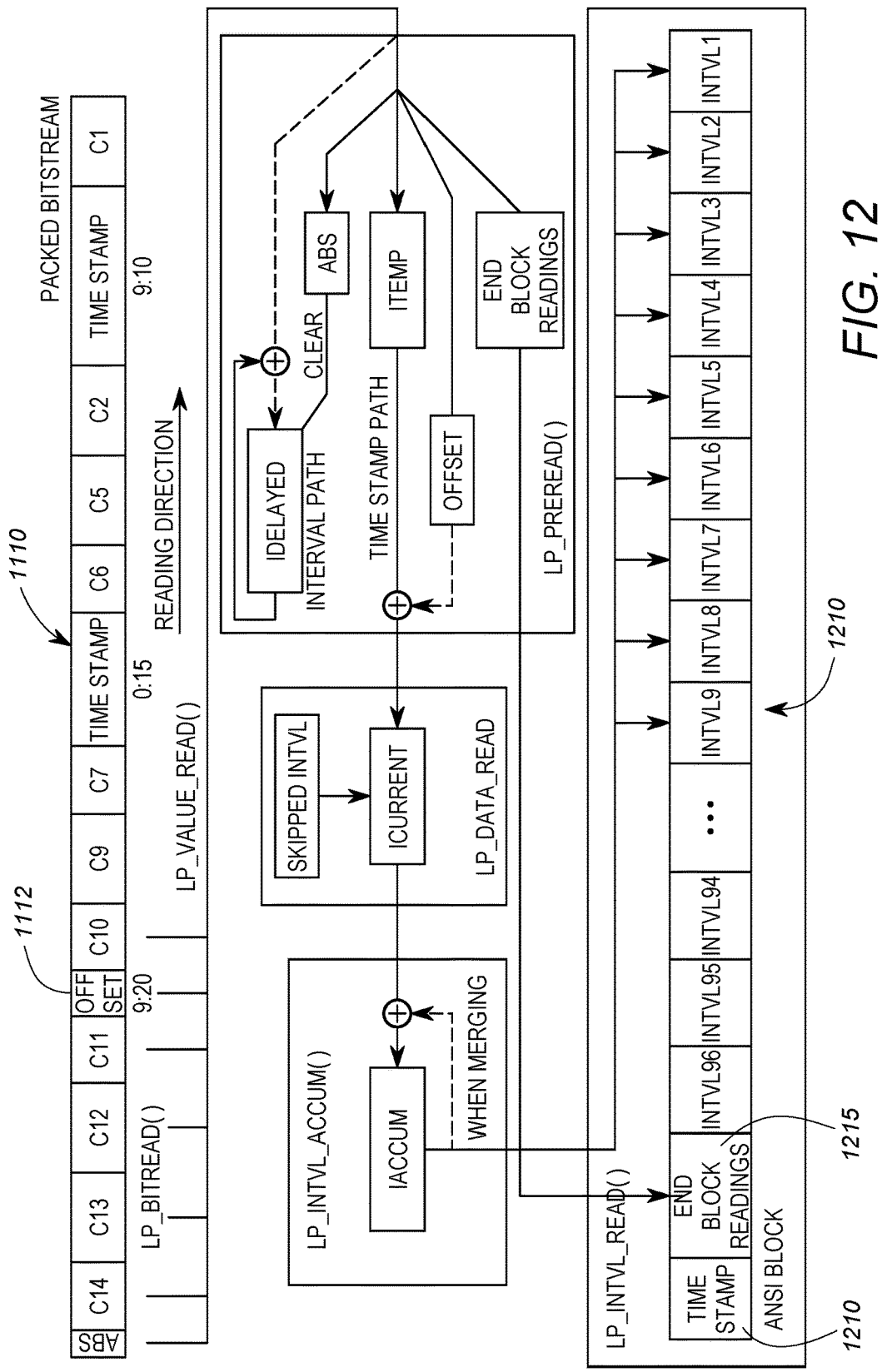
FIG. 12 shows a functional flow diagram of the operations of a processing circuit reading out the compressed data stream generated in FIG. 11.
Figure 15:
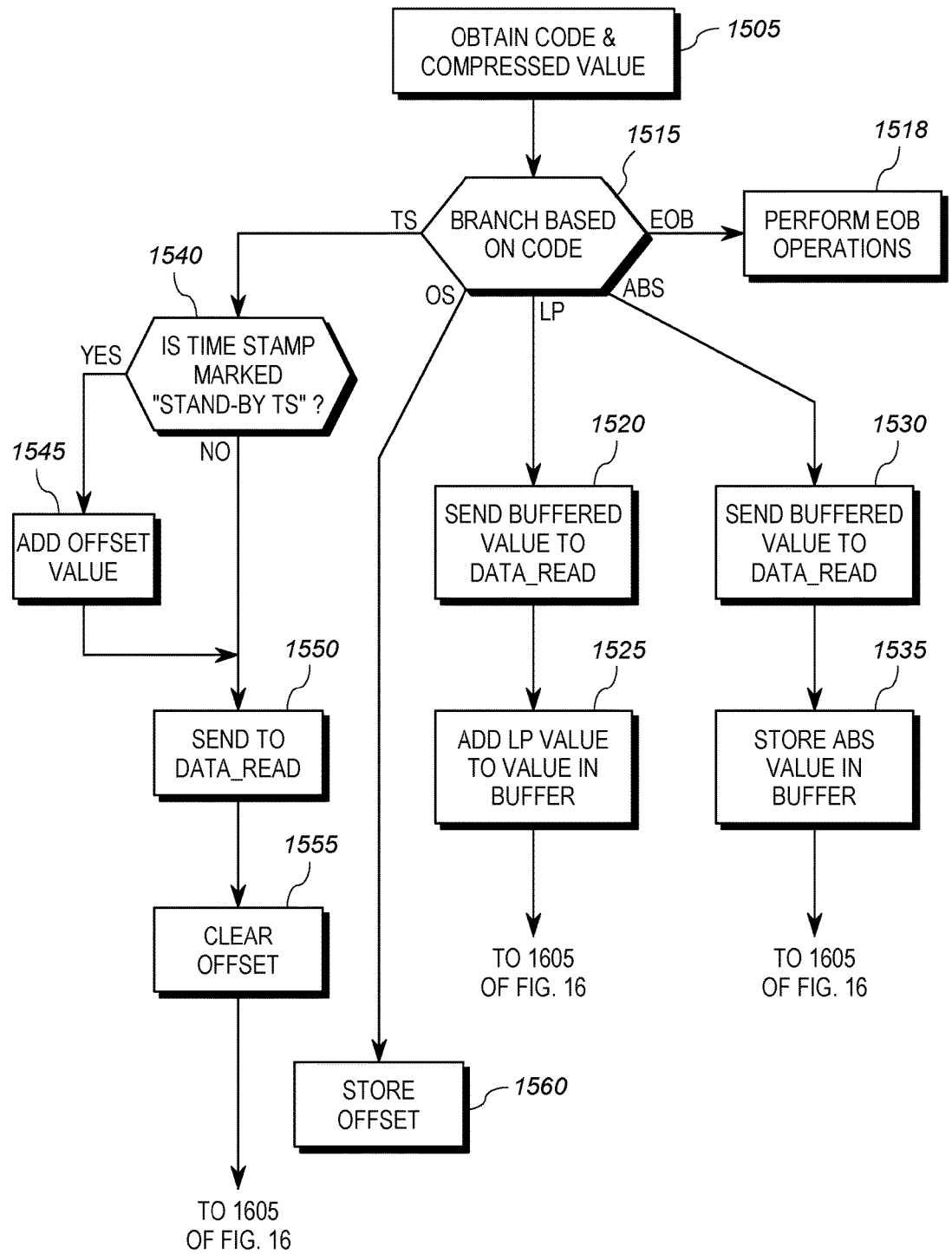
FIG. 15 shows a portion of a flow diagram of a readout operation performed by a processing circuit to generate standard load profile data blocks from a compressed data stream generated using the operations of FIG. 14.

In particular, since the load profile compressed data is read-out backwards, from the present to the past, the time of each interval being read back is determined by simply deducting the length of an interval from the time of the previous interval. In the case of a power outage, one or more intervals may not be recorded into the compressed data stream. Therefore, what is needed is the time of the end of the interval that will be read after processing the gap. Thus, when reading the compressed data stream of FIG. 10, the interval data C2 will be found before the time-stamp. However, the time-stamp needs to be processed (generating one or more skipped intervals), before intvl2 is delivered to the uncompressed load profile block, i.e., to the ANSI layer which expects a standard data format for load profile data. In order to process the time-stamp before delivering the interval intvl2, intervals have to be delayed in the reading process, so that time-stamps can be processed in the proper order, and skipped intervals generated. FIGS. 12 and 15, discussed further below, illustrate a reading algorithm that accomplishes this timing operation by buffering and delaying uncompressed interval data before writing it.

It will be appreciated that the use of the "time stamp" interval illustrated in FIG. 10 provides advantages even if load profile data is not compressed, or compressed using a different compression scheme, particularly if the data is stored sequentially and without individual time stamps for each load profile interval.

Figure 11:
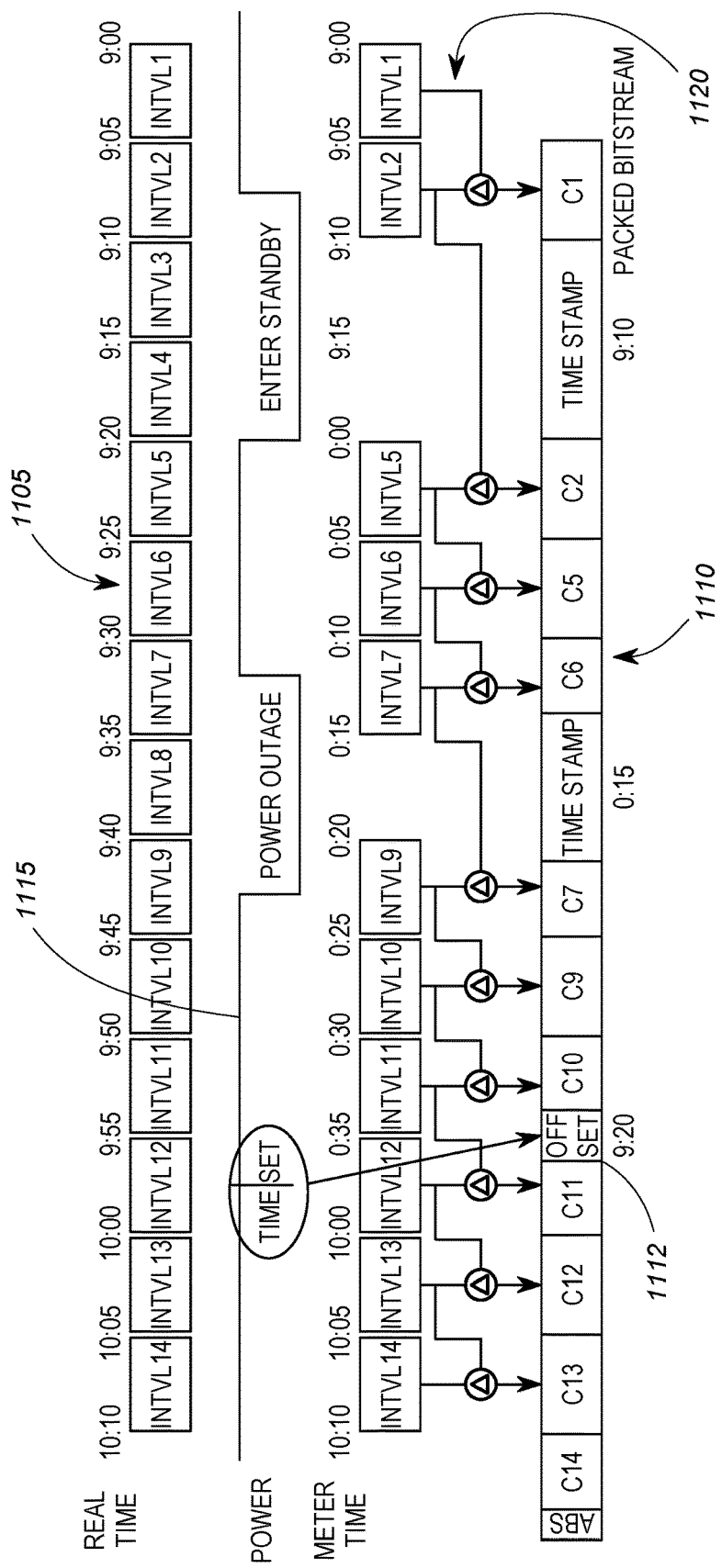
FIG. 11 shows an exemplary timing diagram of the generation of a compressed data stream from a different exemplary sequence of load profile data over several time intervals which include multiple power outages.

FIG. 11 shows timing diagram that illustrates a more complicated sequence of power outages. As discussed above, in some cases, the meter 10 can maintain the real-time clock during a power outage. In other cases, such as an extended power outage, the meter 10 loses the real time clock. When the real time clock is lost, the processing circuit 116 enters a "standby" mode. In the standby mode, the processing circuit 116 sets the real-time clock to a temporary reference time and date. In this embodiment, for example, the processing circuit 116 resets the real-time clock to 0:00:00 on Jan. 1, 2000. At some point, the processing circuit 116 receives a correct, externally generated date and time, such as through the communication circuit 118 or other communication circuit, and then corrects the real-time clock.

However, the clock is not always lost in a power outage. As discussed above in connection with FIG. 10, the real-time clock is maintained during a power outage, even when the processing circuit 116 discontinues most processing. This condition of the meter 10 is sometimes referred to as "sleep mode", wherein a handful of functions, including the real-time clock is maintained substantially all other operations are shut down. This allows the meter 10 (e.g. the processing circuit 116) to maintain the real-time clock for significant amounts of time using temporary power (such as a rechargeable battery within the meter 10, not shown). Thus, in the example of FIG. 10, the real-time clock is maintained using this method. When the meter 10 regains power at 9:18, the processing circuit 116 begins normal processing again, including the operations described above in connection with FIG. 10.

FIGS. 11 and 12 illustrate the compression and decompression process according to an embodiment of the invention that gracefully handles power failures, even when the real-time clock is lost within the meter 10. As mentioned above, following such a loss of the real-time clock, the processing circuit 116 enters a standby mode and the time is set to the temporary reference time until a proper time-and-date is received.

With general reference to FIGS. 11 and 12, FIG. 11 generally illustrates a timing diagram of the load profile operations of the meter 10 wherein the processing circuit 116 converts interval consumption data 1105 into a compressed data stream 1110. The timing diagram also includes a diagram of the power signal 1115 to the meter 10, as well as a block representation of the differential compression operation 1120. FIG. 12 illustrates a block diagram of the decompression process 1205, wherein the compressed data stream 1110 of FIG. 11 is decompressed into a standard ANSI load profile data block 1210. The standard ANSI data block 1210 may be exported to any external device configured to read standard ANSI load profile data.

Figure 14:
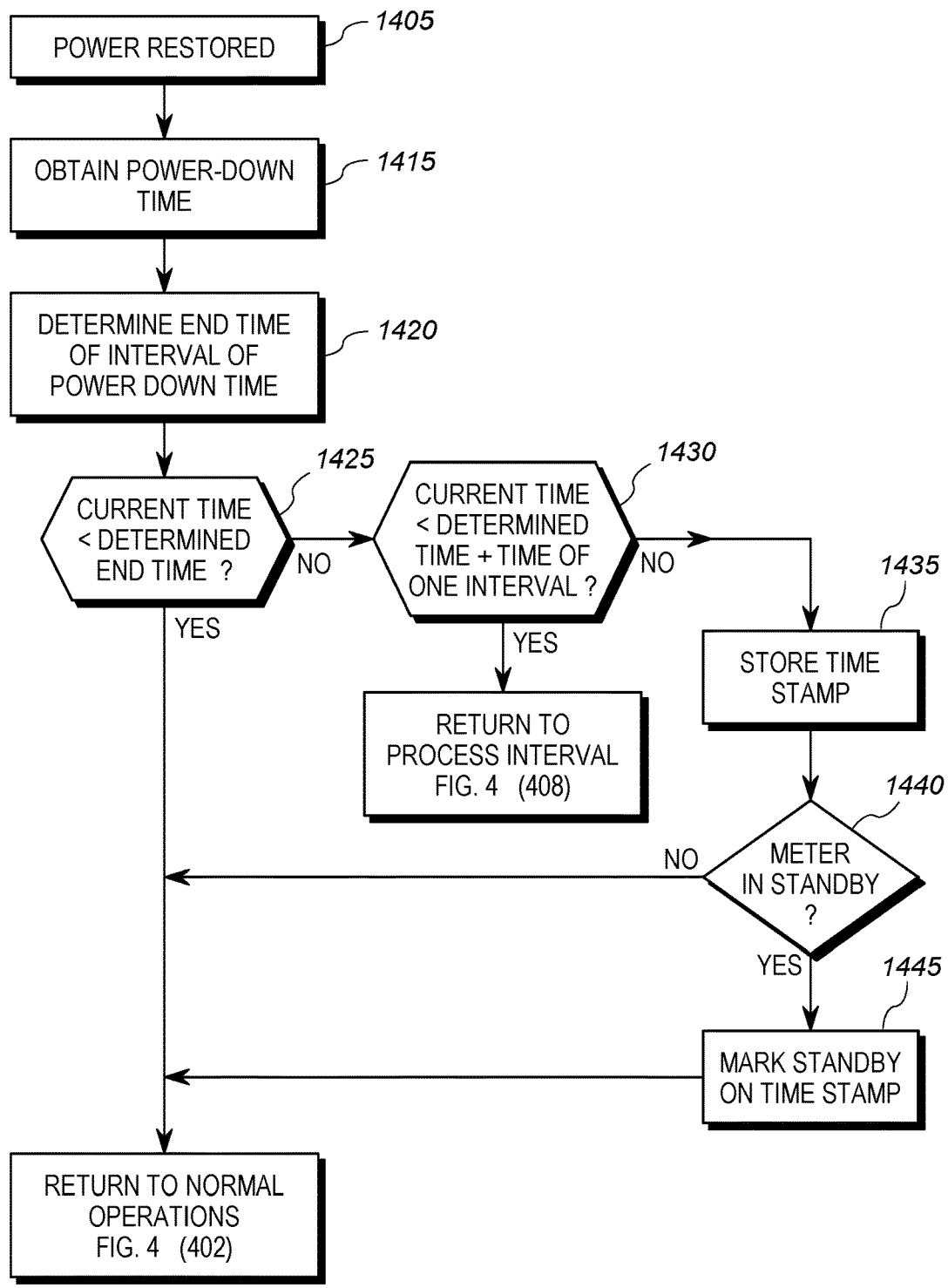
FIG. 14 shows a flow diagram of the operations of the processing circuit of the meter of FIG. 1 in another embodiment of a load profile compression process that generates a compressed data stream.

In addition, FIG. 14 shows a flow diagram 1400 of a modified set of load profile compression operations that may be performed by the processing circuit 116 to achieve the power-outage capable data compression scheme according to this embodiment. Thus, for example, the load profile compression operations of FIG. 14 may be used to convert the load profile data 1105 into the compressed data stream 1110 of FIG. 11.

The operations of FIG. 14 specifically start when power is restored to a meter 10, such as after a power outage, restart, or a sleep mode. In the discussion of FIG. 14, the "load profile operations" describe the operations of the processing circuit 116 executing the load profile process, as opposed to the other functions of the processing circuit 116. In some cases, the "load profile operations" of the processing circuit 116 interact with other processes executed by the processing circuit 116, and/or use values generated by such other processes.

Referring specifically to FIG. 14, when power is restored to the meter 10, it is detected by the load profile operations in step 1405. In step 1415 the load profile operations retrieve the power-down time-and-date information from the memory 112. In step 1420, the load profile operations determine the end time of the load profile interval in which the retrieved power-down time and date fall.

Thereafter, in step 1425, the load profile operations determine if the current time (and date) are equal to or less than the end time determined in step 1420. For example, it is possible that the power outage only lasted a minute or two, and that power was restored prior to the end of the interval. Thus, if the current time (and date) are equal to or less than the end time determined in step 1420, the load profile operations may merely return to normal load profile operations awaiting the end of the current interval. In general, the normal load profile operations can be the operations of FIG. 4, discussed above.

If, however, the current time (and date) are not equal to or less than the end time determined in step 1420, then the load profile operations proceed to step 1430. In step 1430, the load profile operations determined if the current time (and date) are equal to or less than the end time of the next interval, i.e. a time that is an interval greater than the end time determined in step 1420. If so, then the load profile operations may suitably return to the normal operations of FIG. 4, but at step 408, which effectively processes the interval in which the power went down and starts the next interval.

If, however, in step 1430 is determined that the current time is more than a whole interval past the end of the interval in which the power went down, then the load profile operations proceed to step 1435. In step 1435, the load profile operations store in the compressed data stream (e.g. stream 1110 of FIG. 11) a time stamp which comprises the end time determined in step 1420.

Thereafter in step 1440, the load profile operations determine whether the meter 10 was in "standby" when power was lost. As discussed above, standby is a state of the meter 10 in which the meter clock has been lost and the meter processor 116 operates from a temporary clock (e.g. starting at 00:00, Jan. 1, 2000 or some other past reference date and time) until an accurate time and date can be obtained. Upon the restoration of power, other functions of the meter processor 116 attempt to obtain the real-time clock. If the processing circuit 116 determines that the clock has been lost, then the processing circuit 116 starts the clock at the temporary reference time, and sets a flag or other indicator identifying that the meter 10 is in standby. If a subsequent power down occurs, this "standby" flag may suitably be stored in one of the memories 112, 113. If, however, the processing circuit 116 identifies that a valid clock still exists on power up, then it does not set the standby flag and it maintains the current, accurate real-time clock. In such a case, no standby flag is stored in the memories 112, or 113 if power is lost.

Accordingly, in step 1440, the load profile operations identify whether the standby flag maintained by other processes of the processing circuit 116 was stored when power was lost. If so, then the load profile operations proceeds to step 1445 to mark the time stamp generated in step 1435 as a standby time stamp. Such information may be used later if and when the meter 10 receives an accurate real time for the real time clock, as will be discussed further below. In any event, after step 1445, the load profile operations may return to the normal operations of FIG. 4 awaiting the end of the next interval. If the standby flag is not set, then the load profile operations proceed directly from step 1440 to the normal operations of FIG. 4.

An example execution of the steps 1415 to 1435 may be understood with reference to FIG. 10. In FIG. 10, the power signal is lost at 9:08. At the time the power signal is lost, other processes of the processing circuit 116 store in non-volatile memory 112 the time (and date) of the power outage. The processing circuit 116 also stores in non-volatile memory 112 the current load profile values such as measurement values for the current interval. Upon detecting power restoration at 9:18 (step 1405), the processing circuit 116 proceeds to step 1415. In step 1415, the processing circuit 116 obtains the power-down time, 9:08, from the memory 112. Thereafter, in step 1420, the processing circuit 116 determines the end time of the load profile interval that includes the power-down time, 9:08, to be 9:10.

In step 1425, the processing circuit determines that the current time, 9:18, is not within the load profile interval that ends at 9:10. Thus, the processing circuit 116 proceeds to step 1430. In step 1430, the processing circuit 116 determines that the current time, 9:18, is not within the next load profile interval, which ends at 9:15. Accordingly, the processing circuit 116 in step 1435 records the time stamp 9:10 in the compressed data stream. In step 1440, the processing circuit 116 determines that the meter 10 was not in standby mode and resumes the load profile writing operations of FIG. 4.

The operations of FIG. 14 can also be illustrated by the exemplary timing diagram of FIG. 11. Referring to FIG. 11, the processing circuit 116 performs the normal operations of FIG. 4 for generating the compressed data stream 1110 until the power outage at 9:08. Unlike the example of FIG. 10, however, the example of FIG. 11 involves the losing the clock before power up. Thus, upon the restoration of power at the "real" time of 9:20, the processing circuit 116 determines that the meter 10 is in standby. However, because the meter 10 was not in standby mode when the power was lost at 9:08, the load profile operations of the processing circuit 116 store the time stamp of 9:10 in the compressed data stream 1110 (as per step 1435), but do not mark it as a standby time stamp (as per step 1440). The processing circuit 116 can then return to normal load profiling operations, even though the clock is now on temporary "standby" time.

However, as shown in the power signal 1115 of FIG. 11, the meter 10 again loses power at 9:32, while still using the temporary clock, which has a time of 00:12. Thus, the power down operations of the processing circuit 116 store the time of the power outage, 00:12, and a flag indicating that the meter 10 was in standby at the time of the power outage.

Accordingly, when power is restored at 9:43, the processing circuit 116 stores the time stamp of 00:15 (i.e. the end of the interval including the power down time 00:12) in the compressed data stream 1110 (as per step 1435), but also determines in step 1440 that the meter 10 was in standby at the time of the power outage. Thus, the processing circuit 116 in step 1445 marks the time stamp 00:15 in the compressed data stream 1110 as a standby time stamp. The processing circuit 116 then resumes normal load profile operations as per FIG. 4.

At a later point, during the normal operations of FIG. 4, the processing circuit 116 receives a time-set value, which represents the real time, presumably received from an external source. Although not shown in FIG. 4, in response to receive a time-set value, the processing circuit 116 determines the difference between the received time-set value and the temporary clock, and inserts the difference as an offset block 1112 in the compressed data stream 1110, as shown in FIG. 11. The processing circuit 116 may then continue to perform operations as shown in FIG. 4 with the "correct" clock.

It will be appreciated that when the real-time clock is restored, the intervals in standby time will not always align with the intervals in real-time. Accordingly, in at least some embodiments, the processing circuit 116 is configured to re-align the intervals after a reset of the real time clock. In general, there are basically three cases (from simpler to more complex) for when the meter 10 enters standby and then the clock is reset to the proper time:

1) The meter 10 enters standby and then, shortly after that, the proper time is recovered. In this case, all that is required is to re-synchronize intervals as best as possible, creating a long or short interval in the process. Through this process, a short interval should be no shorter than 0.5 times a normal interval and a long interval no longer than 1.5 times a normal interval. Thus, for example, if the reset of FIG. 11 had actually occurred at 9:19 (i.e. reference time 0:00), and the real-time clock had been recovered at 9:23 (i.e. reference time 0:04), then processing circuit 116 can simply generate a long interval that ends at 9:25 which would include the data for the entire six minutes. If the reset of FIG. 11 had occurred at 9:21 (i.e. reference time 0.00), and the clock had been recovered at 9:23 (i.e. reference time 0:02), then the processing circuit 116 can simply generate a short interval that ends at 9:25 which would only include the data for four minutes. In either case, the processing circuit 116 continues thereafter to process the proper and synchronized five minute intervals.

2) The meter 10 enters standby and then, before the actual time and date is recovered, the meter 10 experiences one or more short power outage(s). When the time is set, the offset value is inserted in the bit-stream in such a way that the time stamp of any previous power outage can be adjusted to calculate the real time when the power outage happened. This allows for the data to be returned as if standby did not happen, when any recorder is read. This scenario is illustrated in FIG. 11, and its implementation discussed below in connection with FIG. 16.

3) The meter 10 enters standby, but before actual time is recovered, the meter 10 experiences an event such as a long power outage that causes the meter to re-enter standby. In this case, the exact time for the recorded data is unknown, but that it is bound by older data and new data whose time is known. This data is labeled "unaligned", and the user (i.e. the utility) has the choice to include or not include this data when reading any particular recorder.

The result of the operations of FIGS. 4 and 14 is a compressed data stream that may or may not include time stamps from an accurate real time clock within the meter, time stamps from a temporary clock within the meter, and/or time offset values, in addition to the other elements of the compressed data stream discussed above in connection with FIGS. 5A, 5B, and 6A-6C. The time stamps and offset values of this embodiment enable a reading device to properly construct an ANSI formatted load profile block even when power is lost in the meter.

Referring to FIGS. 12, 15 and 16, a reading process is provided that is particularly designed to provide decompression and presentation of data in a standardized format, such as that defined by ANSI standards. Thus, the operations of FIGS. 12, 15 and 16 are designed to be carried out by the meter processing circuit 116, but may alternatively be carried out by a separate reader processor such as the processor 802 of FIG. 8. FIG. 12 also shows the timing diagram of FIG. 11 as a reference.

As discussed above, the load profile data in the packed stream 1110 is stored such that the deltas (see, e.g. step 410) between metering values of two intervals is encoded and recorded, which provides a smaller number that is easier to encode to a shorter bit pattern. However, the output of the reading algorithm must be absolute (actual) values for each interval. Because each sets of interval values (e.g. C1, C2, C5 of stream 1110) is representative of deltas of values between two intervals, the encoded bit pattern that represents a particular interval is always delayed by one interval before it shows up in the bit-stream. (See, e.g. FIG. 7). Other pieces of information, such as time-stamps, or off sets, can be placed in the compressed data stream 1110 without delay. When reading back the data, which is done in the opposite direction (from present to the past), the intervals must also be delayed in order to process them in the right sequence with the time-stamps and end-block readings. It will be appreciated that an end-block reading is an industry standard event that indicates the end of a block for load profile data.

FIGS. 15 and 16 in particular show a flow diagram of readout operations performed by the processing circuit 116 or the readout device 802 to carry out a reading process to generate an ANSI standard data block (1210 of FIG. 12) from a compressed data stream (e.g. 1110) generated by the load profile operations of FIGS. 4, 11, and 14. The flow diagram 1500 may be invoked at any time it is desired to decompress the load profile data streams to generate the ANSI standard data blocks. In the discussion of FIGS. 15 and 16, the "readout process" constitutes the operations of the processing circuit 116 (or readout processor 802) executing the load profile process, as opposed to the other operations of the processing circuit 116. The operations of FIGS. 15 and 16 are performed for each time stamp (e.g. 512 of FIG. 5A), end of block reading, offset (see FIGS. 11 and 12), absolute value data block (e.g. 514 of FIG. 5A), and compressed interval $CI_x$ (e.g. 505 of FIG. 5A). The general description of FIGS. 15 and 16 will be made in reference to the non-limiting example of load profile data illustrated in FIGS. 11 and 12.

In step 1505, the readout process obtains the prefix (code) of the next data block (hereinafter referred to as the "current data block") in the compressed data stream 1110. As discussed above in connection with FIGS. 6A, 6B and 6C, for example, each type of data block has a start code (e.g. 610, 618 and 622) identifying the type of block that is being received.

In step 1515, the readout process branches on the obtained prefix code of the current data block. If the prefix indicates an end-of-block (EOB), then the readout process proceeds to step 1518. If the prefix indicates a load profile value (LP), then the readout process proceeds to step 1520. If the prefix indicates an absolute value (ABS), then the readout process proceeds to step 1530. If the prefix indicates a time stamp (TS), then the readout process proceeds to step 1540. If the prefix value indicates an offset (OS), then the readout process proceeds to step 1560.

Accordingly, the readout process executes step 1518 if an end-of-block indicator is identified. In such a case, the readout process directly creates the ANSI end of block data segment and insert a time stamp in the ANSI data block (e.g. time stamp 1210 and end of block segment 1215 of ANSI block 1205 of FIG. 12).

The readout process executes step 1520 if the prefix code identifies a load profile value, e.g. a compressed interval 505 discussed above in connection with FIGS. 5A and 6A. Thus, the current data block includes one or more metering values in compressed differential form, generated as discussed above in connection with FIG. 4. Before processing the current data block, however, the readout process in step 1520 provides existing values in an LP buffer to a data insertion function. The data insertion function is illustrated in FIG. 16 and discussed further below. The existing values in the LP buffer represent the absolute load profile (energy consumption and status) values for previously processed interval. Those existing values, which do not include data from the current data block, are provided to the data insertion function of FIG. 16 for final processing and insertion into the ANSI data block, as will be discussed below in detail in connection with FIG. 16. The operation of the LP buffer provides a one-data block delay in the writing of decompressed data to the ANSI block 1210.

In any event, in step 1525, compressed interval values of the current data block are now processed. Specifically, the compressed differential values of the current data block are decompressed, as per steps 908-922 and 926 of FIG. 9, and then added to the existing values in the LP buffer (see step 924 of FIG. 9). Because the decompressed metering values are differential values between two time intervals, and because the existing values in the LP buffer are the actual set of values from the next time period, the new total in the LP buffer should be the absolute value for the next time interval to be processed. The readout process thereafter proceeds to step 1605 of FIG. 16.

Referring again to step 1515, the readout process executes step 1530 if the prefix of the value obtained in step 1505 indicates an absolute value. In step 1530, the existing values in the LP buffer are provided to the data insertion process for final processing and insertion into the ANSI data block, and are subsequently cleared from the LP buffer. In step 1535, the absolute values of the data block are decompressed and then stored in the LP buffer. As discussed above, the absolute values are not differential, and thus are not added or subtracted from previous values. Thus, the LP buffer is cleared (in step 1530) before the absolute values in the suffix are added to the LP buffer (step 1535). The readout process thereafter proceeds to step 1605 of FIG. 16.

If in step 1515 it is determined that a time stamp has been received in the suffix in step 1505, then in step 1540, the readout process determines if the time stamp is marked as a standby time stamp. As noted above, time stamps generated in "standby" mode are based on a temporary clock that is not accurate. If the time stamp is marked as a standby time stamp, then the readout process proceeds to step 1545. If not, then the readout process proceeds to step 1550.

In step 1545, a stored "offset" value from an offset buffer is added to the time-stamp. To this end, the compressed data stream 1110, which is read out in reverse chronological order, can include an offset value (e.g. 1112) generated by the load profile operations when the real time clock is recovered in standby operation. The offset value stored in the offset buffer represents the difference between the recovered real-time clock and the temporary clock that was used during standby. For example, referring to FIG. 11, the time set received at approximate 9:57 is stored in the compressed data stream 1110 as an offset value "9:20" because the difference between the real-time clock received at 9:47 and the standby clock is 9:20. In step 1545, the "standby time stamp" is adjusted by the offset value stored in the offset buffer. Thus, referring to FIG. 11, the time stamp 00:15 would be adjusted to a time stamp of 9:35 in step 1545, which corresponds to the real time of the power outage.

Referring again generally to the operations of FIG. 15, after step 1545, the readout process proceeds to step 1550. In step 1550, the readout process sends the time stamp (whether or nor modified in step 1545) to the data insertion operation of FIG. 16. Thereafter, in step 1555, the offset value in the offset buffer is cleared, and the readout process proceeds to step 1605 of FIG. 16.

If in step 1515 the detected prefix indicates that the current data block is an offset value (e.g. offset value block 1112 of FIG. 11), then the readout process executes step 1560. In step 1560, the offset value is stored in the offset buffer for possible subsequent use in adjusting a standby time stamp that is subsequently encountered in the compressed data stream.

As discussed above, FIG. 16 illustrates the data insertion function of the readout process. In accordance with the operations of FIG. 15, the data insertion function of FIG. 16 receives either a time stamp or a set of interval load profile values. The reception of either value by the data insertion function is represented as step 1605. In step 1610, the data insertion function determines whether the value received in step 1605 is a time stamp. If not, then the data insertion function proceeds to step 1615 to process the received uncompressed and actual energy consumption values for the next load profile interval of the standard data block 1210 to be written.

If, however, the value received in step 1605 is a time stamp, then the data insertion function proceeds to step 1640 to process the time stamp. Referring to step 1640, the data insertion function determines, based on the time stamp and the internal tracking of the current interval, whether any intervals are missing. In particular, the data insertion function keeps track sequential of the end times of each successive interval as they are written to the ANSI block 1210. However, after a power outage, it is possible that the time stamp will not coincide with the expected time tracked by the processing circuit 116, due to the fact that the power outage lasted more than the time period of a load profile interval. For example, referring to FIG. 11, the readout process processing the time stamp 9:10 between compressed intervals C2 and C1 in the data stream 1110 will have tracked the time to 9:20, the end of the last processed interval C2. However, the time stamp of 9:10 indicates to the processing circuit 116 that two intervals have been missed, which in FIG. 11 include Intvl3 and Intvl4. Thus, in step 1640, the data insertion function determines whether any (and how many) intervals are missing, based on the received time stamp, and the intervals tracked by the data insertion function.

If there are intervals missing, then the data insertion function in step 1645 writes zero values to each ANSI block time interval segment corresponding to the missing intervals. Thus, in the example of FIGS. 11 and 12, the data insertion function in step 1645, after receiving the time stamp 9:10, would write two "zero" value intervals into the ANSI block 1210 in the data segments corresponding to Intvl3 and Intvl4. After step 1645, the data insertion function is complete and the readout process returns to readout the next compressed value from the compressed data stream 1110 in step 1505 of FIG. 15.

Figure 13:
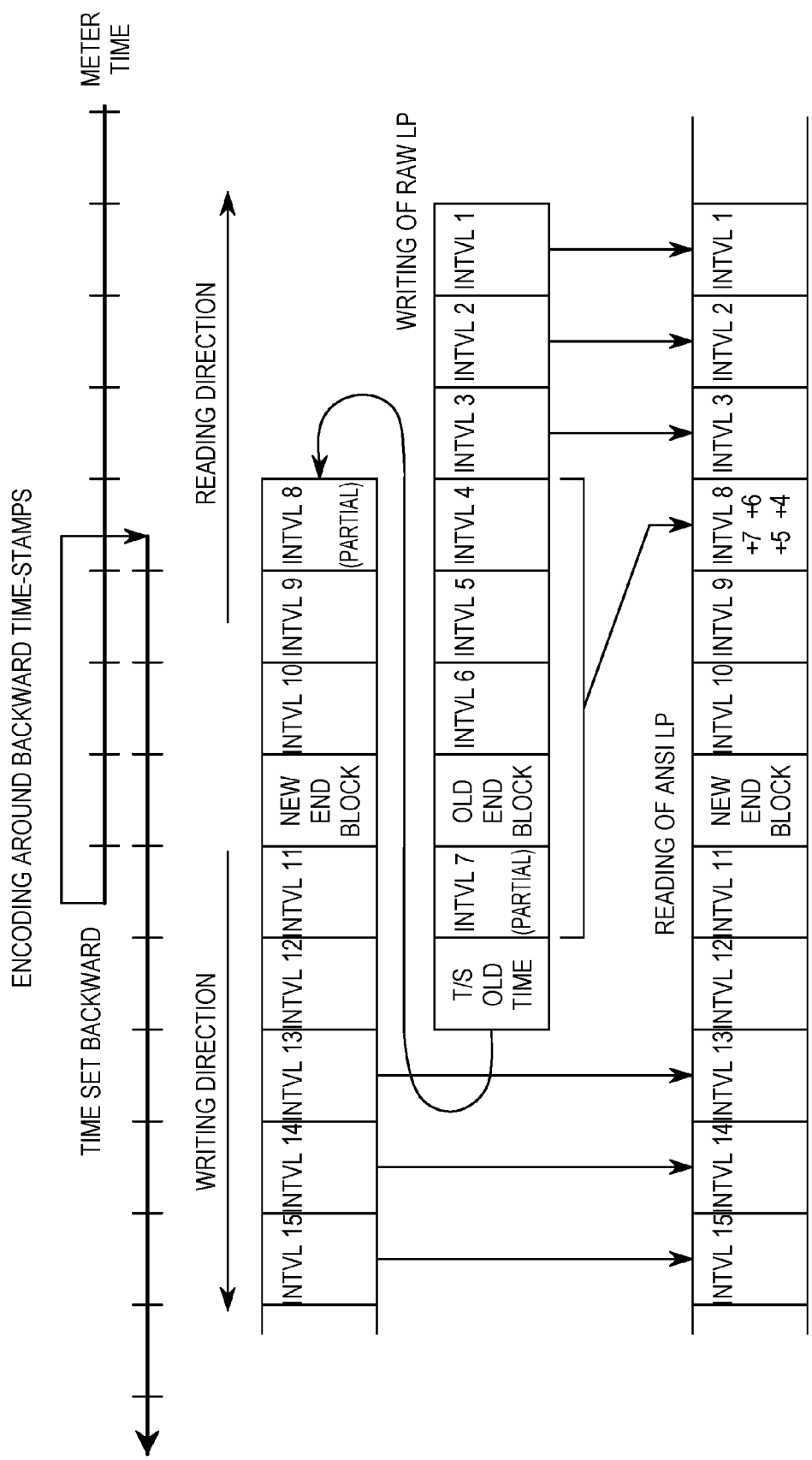
FIG. 13 shows a timing diagram of data stored in wherein time is reset backwards within a meter.

If in step 1640 it is determined that no intervals are missing, then the readout process executes step 1650. In step 1650, it is determined whether the time has been set backwards. In rare cases, the real time clock of a meter can be set backwards, sometimes for a period covering several intervals. This is illustrated in FIG. 13. As shown in FIG. 13, if the time clock has been set backwards, then intervals can overlap. In such a case, the data insertion function disclosed herein merges all of the "overlapped" intervals into a single interval. FIG. 13 illustrates an example of this, where Intvl8 includes the data values from Intvl4, Intvl5, Intvl6, and Intvl7 added to the values from Intvl8). Referring again to FIG. 16, in step 1650, if the time clock has been set backwards, then the data insertion function proceeds to step 1655. In step 1655, the data insertion operation sets a counter N equal to the number of intervals that will need to be merged. After step 1655, the data insertion function is complete and the readout process returns to readout the next compressed value from the compressed data stream in step 1505 of FIG. 15. Likewise, if in step 1650 it is determined that the time clock has not been set backwards, then the readout process proceeds directly to step 1505 of FIG. 15 without executing step 1655.

Referring again to step 1610, if it is determined that the data insertion function has received load profile metering values (as opposed to a time stamp), then the data insertion function executes step 1615. In step 1615 the data insertion function determines whether the counter N>0. If so, then the data insertion function is in the process of merging intervals, and proceeds to step 1630. If not, then the data insertion function proceeds to step 1620.

In step 1620, the decompressed metering/LP values received from the operations of FIG. 15 are added to any values stored in a merge buffer. The merge buffer will typically be empty prior to receiving the values in step 1620, except in the rare circumstances when intervals are being merged due to a backwards time set, as will be discussed below.

In any event, in step 1622, the contents of the merge buffer are written to or stored in the next segment of the ANSI block 1210, and the merge buffer is cleared. As shown in FIG. 12, the slots or segments of the block 1210 are stored in reversed chronological order, as they are processed by the readout process. After storing the LP values from the merge buffer in the next ANSI block slot, the processing circuit 116 indexes an internal counter to track the next interval to be processed in step 1625. The readout process may then return to receive the next compressed value in step 1505 of FIG. 15.

In step 1630, which occurs when the merge counter N is greater than 0, the data insertion function adds the decompressed LP values received from the operations of FIG. 15 to a running total of LP values in the merge buffer. Thereafter, the readout process executes step 1635 to decrement N, and then returns to step 1505 of FIG. 15. Thus, as long as N is greater than zero, no values are stored in the next slot or segment of the ANSI block 1210, and the merge buffer accumulates LP values.

The above-discussed operations thus show how a compression scheme similar to that described above in connection with FIGS. 1-9 can be adopted to gracefully handle power outages, including those in which a real time clock is lost. These operations can readily be adopted to other compression schemes that are based on differential values, or even uncompressed load profile data streams that use differential values instead of absolute values.

It will be appreciated that the above-described embodiments are merely illustrative, and that those of ordinary skill in the art may readily devise their own modifications and implementations that incorporate the principles of the present invention and fall within the spirit and scope thereof.

What is claimed is:

1. A method for storing information within a utility meter, comprising:
    storing a load profile data stream comprising a plurality of data values relating to at least one metered quantity delivered to a load corresponding to a plurality of sequential time periods, wherein the plurality of data values are stored sequentially in adjacent memory locations based on their corresponding time periods;
    responsive to a power restoration after a power outage, determining an end time for a power outage time period, wherein the power outage time period is a time period in which the power outage occurred;
    comparing the end time for the power outage time period with a current time; and
    when the current time is more than one time period past the end time for the power outage time period, inserting into the load profile data stream a time stamp corresponding to the end time for the power outage time period.

2. The method of claim 1, further comprising storing the time stamp in the memory between a first memory location in which a first data value is stored, the first data value corresponding to a first time period occurring immediately before the power outage and a second memory location in which a second data value is stored, the second data value corresponding to a second time period occurring immediately after the time period.

3. The method of claim 1, further comprising storing no data values in the memory for at least one time period during the power outage.

4. The method of claim 1, wherein each of the plurality of data values includes a differential value representative of a difference in the metered quantity between the corresponding time period and another time period.

5. The method of claim 4, further comprising generating each differential value by compressing the difference in the metered quantity.

6. The method of claim 1, wherein each of the plurality of data values is a compressed value.

7. The method of claim 1, further comprising:
    responsive to a loss of a meter real-time clock, continuing to store a plurality of data values regarding a metered quantity delivered to a load corresponding to a second plurality of sequential time periods, wherein the plurality of data values are stored sequentially in adjacent memory locations based on their corresponding time periods.

8. The method of claim 7, further comprising:
    responsive to restoring the meter real-time clock, generating an offset based on a difference between a temporary reference real-time clock and a value representative of actual real time.

9. A metering circuit, comprising:
    a metrology circuit operably coupled to a load, the metrology circuit configured to generate energy consumption values based on the voltage and current provided to the load;
    at least one memory; and
    a processing circuit configured to
        generate information regarding a metered quantity delivered to a load corresponding to each of a plurality of sequential time periods;
        store, in the at least one memory, a load profile data stream comprising a plurality of data values regarding the metered quantity corresponding to the plurality of sequential time periods, wherein the plurality of data values are stored in sequential memory locations based on their corresponding time periods;
        responsive to a power restoration after a power outage, determine an end time for a power outage time period, wherein the power outage time period is a time period in which the power outage occurred;
        compare the end time for the power outage time period with a current time; and
        when the current time is more than one time period past the end time for the power outage time period, insert into the load profile data stream a time stamp corresponding to the end time for the power outage time period.

10. The metering circuit of claim 9, wherein the processing circuit is further configured to store the time stamp between a first memory location in which a first data value is stored, the first data value corresponding to a first time period occurring immediately before the power outage and a second memory location in which a second data value is stored, the second data value corresponding to a second time period occurring immediately after the time period.

11. The metering circuit of claim 9, wherein the processing circuit is further configured to store no data values in the memory for at least one time period during the power outage.

12. The metering circuit of claim 9, wherein each of the plurality of data values is a differential value representative a difference in the metered quantity between the corresponding time period and another time period.

13. The metering circuit of claim 12, wherein the processing circuit is further configured to generate each differential value by compressing the difference in the metered quantity.

14. The metering circuit of claim 9, wherein each of the plurality of data values is a compressed value.

15. The metering circuit of claim 9, wherein:

the memory further comprises physical memory blocks;

the processor is further configured to store a first data value corresponding to a first time period in a first physical memory block;

the processor is further configured to store a second data value corresponding to a second time period occurring immediately after the first time period at least in part in a second physical memory block that is adjacent to the first physical memory block.

16. The metering circuit of claim 10, wherein the each of the plurality of sequential time periods represents a predetermined time interval.

17. The metering circuit of claim 9, wherein the each of the plurality of sequential time periods represents a predetermined time interval.

18. The metering circuit of claim 1, wherein each of the plurality of sequential time periods represents a predetermined time interval.

* * * * *